United States Patent
Hu et al.

(10) Patent No.: US 12,180,108 B2
(45) Date of Patent: Dec. 31, 2024

(54) METHODS FOR ETCHING VIAS IN GLASS-BASED ARTICLES EMPLOYING POSITIVE CHARGE ORGANIC MOLECULES

(71) Applicant: Corning Incorporated, Corning, NY (US)

(72) Inventors: Hongmei Hu, Painted Post, NY (US); Tian Huang, Painted Post, NY (US); Yuhui Jin, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 510 days.

(21) Appl. No.: 16/204,496

(22) Filed: Nov. 29, 2018

(65) Prior Publication Data
US 2019/0185373 A1    Jun. 20, 2019

Related U.S. Application Data

(60) Provisional application No. 62/607,638, filed on Dec. 19, 2017.

(51) Int. Cl.
*C03C 15/00* (2006.01)
*C03B 33/02* (2006.01)
(Continued)

(52) U.S. Cl.
CPC .......... *C03C 15/00* (2013.01); *C03B 33/0222* (2013.01); *C03C 23/006* (2013.01); *C08F 226/04* (2013.01)

(58) Field of Classification Search
None
See application file for complete search history.

(56) References Cited

U.S. PATENT DOCUMENTS

| 108,387 A | 10/1870 | Pike |
| 208,387 A | 9/1878 | Geoege |
| (Continued) | | |

FOREIGN PATENT DOCUMENTS

| AU | 2004276725 A1 | 4/2005 |
| AU | 2011101310 A4 | 11/2011 |
| (Continued) | | |

OTHER PUBLICATIONS

Benjamin et al; "The Adhesion of Evaporated Metal Films on Glass"; Proc. Roy. Soc. A., vol. 261, (1962); pp. 516-531.
(Continued)

*Primary Examiner* — Queenie S Dehghan
(74) *Attorney, Agent, or Firm* — Amy T. Lang

(57) ABSTRACT

Methods of forming vias in a glass-based article by laser-damage-and-etch processes including etching solutions having positive charge organic molecules are disclosed. In some embodiments, a method of forming a via in a glass-based article includes forming a damage track through a bulk of the glass-based article extending from a first surface of the glass-based article to a second surface of the glass-based article, and applying an etching solution to the glass-based article to form the via. The etching solution includes at least one acid and a positive charge organic molecule. An etch rate at the first surface and the second surface is lower than an etch rate at the damage track.

20 Claims, 17 Drawing Sheets

(51) Int. Cl.
*C03C 23/00* (2006.01)
*C08F 226/04* (2006.01)

(56) References Cited

U.S. PATENT DOCUMENTS

| | | |
|---|---|---|
| 237,571 A | 2/1881 | Messier |
| 1,790,397 A | 1/1931 | Woods et al. |
| 2,682,134 A | 6/1954 | Stookey |
| 2,749,794 A | 6/1956 | O'Leary |
| 3,647,410 A | 3/1972 | Heaton et al. |
| 3,695,497 A | 10/1972 | Dear |
| 3,695,498 A | 10/1972 | Dear |
| 3,713,921 A | 1/1973 | Fleischer et al. |
| 3,729,302 A | 4/1973 | Heaton |
| 3,775,084 A | 11/1973 | Heaton |
| 3,798,013 A | 3/1974 | Hasegawa et al. |
| 4,226,607 A | 10/1980 | Domken |
| 4,395,271 A | 7/1983 | Beall et al. |
| 4,441,008 A | 4/1984 | Chan |
| 4,546,231 A | 10/1985 | Gresser et al. |
| 4,547,836 A | 10/1985 | Anthony |
| 4,564,579 A | 1/1986 | Morita et al. |
| 4,646,308 A | 2/1987 | Kafka et al. |
| 4,764,930 A | 8/1988 | Bille et al. |
| 4,891,054 A | 1/1990 | Bricker et al. |
| 4,907,586 A | 3/1990 | Bille et al. |
| 4,918,751 A | 4/1990 | Pessot et al. |
| 4,929,065 A | 5/1990 | Hagerty et al. |
| 4,948,941 A | 8/1990 | Altman et al. |
| 5,022,959 A | 6/1991 | Itoh et al. |
| 5,035,918 A | 7/1991 | Vyas |
| 5,040,182 A | 8/1991 | Spinelli et al. |
| 5,089,062 A | 2/1992 | Pavlik et al. |
| 5,102,498 A | 4/1992 | Itoh et al. |
| 5,104,210 A | 4/1992 | Tokas |
| 5,108,857 A | 4/1992 | Kitayama et al. |
| 5,112,722 A | 5/1992 | Tsujino et al. |
| 5,114,834 A | 5/1992 | Nachshon |
| 5,166,493 A | 11/1992 | Inagawa et al. |
| 5,208,068 A | 5/1993 | Davis et al. |
| 5,265,107 A | 11/1993 | Delfyett, Jr. |
| 5,314,522 A | 5/1994 | Kondo et al. |
| 5,374,291 A | 12/1994 | Yabe et al. |
| 5,400,350 A | 3/1995 | Galvanauskas |
| 5,434,875 A | 7/1995 | Rieger et al. |
| 5,436,925 A | 7/1995 | Lin et al. |
| 5,457,836 A | 10/1995 | Wiedeck |
| 5,493,096 A | 2/1996 | Koh |
| 5,553,093 A | 9/1996 | Ramaswamy et al. |
| 5,574,597 A | 11/1996 | Kataoka |
| 5,575,291 A | 11/1996 | Hayakawa et al. |
| 5,575,936 A | 11/1996 | Goldfarb |
| 5,586,138 A | 12/1996 | Yokoyama |
| 5,696,782 A | 12/1997 | Harter et al. |
| 5,736,709 A | 4/1998 | Neiheisel |
| 5,745,236 A | 4/1998 | Haga |
| 5,746,884 A | 5/1998 | Gupta et al. |
| 5,776,220 A | 7/1998 | Allaire et al. |
| 5,844,200 A | 12/1998 | Leader et al. |
| 5,879,424 A | 3/1999 | Nishii et al. |
| 5,909,284 A | 6/1999 | Nakamura |
| 5,919,607 A | 7/1999 | Lawandy |
| 5,933,230 A | 8/1999 | Imaino et al. |
| 5,965,043 A | 10/1999 | Noddin et al. |
| 6,016,223 A | 1/2000 | Suzuki et al. |
| 6,016,324 A | 1/2000 | Rieger et al. |
| 6,055,829 A | 5/2000 | Witzmann et al. |
| 6,072,624 A | 6/2000 | Dixon et al. |
| 6,078,599 A | 6/2000 | Everage et al. |
| 6,120,131 A | 9/2000 | Murthy et al. |
| 6,140,243 A | 10/2000 | Wallace et al. |
| 6,143,382 A | 11/2000 | Koyama et al. |
| 6,156,030 A | 12/2000 | Neev |
| 6,160,835 A | 12/2000 | Kwon |
| 6,186,384 B1 | 2/2001 | Sawada |
| 6,210,401 B1 | 4/2001 | Lai |
| 6,224,713 B1 | 5/2001 | Hembree et al. |
| 6,234,755 B1 | 5/2001 | Bunker et al. |
| 6,256,328 B1 | 7/2001 | Delfyett et al. |
| 6,259,151 B1 | 7/2001 | Morrison |
| 6,259,512 B1 | 7/2001 | Mizouchi |
| 6,272,156 B1 | 8/2001 | Reed et al. |
| 6,301,932 B1 | 10/2001 | Allen et al. |
| 6,308,055 B1 | 10/2001 | Welland et al. |
| 6,319,867 B1 | 11/2001 | Chacon et al. |
| 6,322,958 B1 | 11/2001 | Hayashi |
| 6,338,901 B1 | 1/2002 | Veerasamy |
| 6,339,208 B1 | 1/2002 | Rockstroh et al. |
| 6,344,242 B1 | 2/2002 | Stolk et al. |
| 6,373,565 B1 | 4/2002 | Kafka et al. |
| 6,381,391 B1 | 4/2002 | Islam et al. |
| 6,391,213 B1 | 5/2002 | Homola |
| 6,396,856 B1 | 5/2002 | Sucha et al. |
| 6,399,914 B1 | 6/2002 | Troitski |
| 6,407,360 B1 | 6/2002 | Choo et al. |
| 6,420,088 B1 | 7/2002 | Angelopoulos et al. |
| 6,438,996 B1 | 8/2002 | Cuvelier |
| 6,445,491 B2 | 9/2002 | Sucha et al. |
| 6,449,301 B1 | 9/2002 | Wu et al. |
| 6,484,052 B1 | 11/2002 | Visuri et al. |
| 6,489,589 B1 | 12/2002 | Alexander |
| 6,501,578 B1 | 12/2002 | Bernstein et al. |
| 6,537,937 B1 | 3/2003 | Nishizawa et al. |
| 6,552,301 B2 | 4/2003 | Herman et al. |
| 6,563,079 B1 | 5/2003 | Umetsu et al. |
| 6,573,026 B1 | 6/2003 | Aitken et al. |
| 6,592,703 B1 | 7/2003 | Habeck et al. |
| 6,635,849 B1 | 10/2003 | Okawa et al. |
| 6,635,850 B2 | 10/2003 | Amako et al. |
| 6,720,519 B2 | 4/2004 | Liu et al. |
| 6,729,161 B1 | 5/2004 | Miura et al. |
| 6,737,345 B1 | 5/2004 | Lin et al. |
| 6,744,009 B1 | 6/2004 | Xuan et al. |
| 6,754,429 B2 | 6/2004 | Borrelli et al. |
| 6,787,732 B1 | 9/2004 | Xuan et al. |
| 6,794,605 B2 | 9/2004 | Park et al. |
| 6,800,237 B1 | 10/2004 | Yamamoto et al. |
| 6,800,831 B1 | 10/2004 | Hoetzel |
| 6,906,795 B2 | 6/2005 | Goto et al. |
| 6,958,094 B2 | 10/2005 | Ohmi et al. |
| 6,990,285 B2 | 1/2006 | Schroeder et al. |
| 6,992,026 B2 | 1/2006 | Fukuyo et al. |
| 6,992,030 B2 | 1/2006 | Paulson |
| 7,008,817 B2 | 3/2006 | Kim et al. |
| 7,009,138 B2 | 3/2006 | Amako et al. |
| 7,019,257 B2 | 3/2006 | Stevens |
| 7,033,519 B2 | 4/2006 | Taylor et al. |
| 7,043,072 B2 | 5/2006 | Goto et al. |
| 7,057,135 B2 | 6/2006 | Li |
| 7,084,073 B2 | 8/2006 | Lee et al. |
| 7,211,899 B2 | 5/2007 | Taniguchi et al. |
| 7,337,540 B2 | 3/2008 | Kurosawa |
| 7,353,829 B1 | 4/2008 | Wachter et al. |
| 7,407,889 B2 | 8/2008 | Tsunetomo et al. |
| 7,511,886 B2 | 3/2009 | Schultz et al. |
| 7,528,967 B2 | 5/2009 | Okawauchi et al. |
| 7,534,734 B2 | 5/2009 | Ellison |
| 7,535,634 B1 | 5/2009 | Savchenkov et al. |
| 7,626,665 B2 | 12/2009 | Koike |
| 7,633,033 B2 | 12/2009 | Thomas et al. |
| 7,642,483 B2 | 1/2010 | You et al. |
| 7,649,153 B2 | 1/2010 | Haight et al. |
| 7,683,370 B2 | 3/2010 | Kugimiya et al. |
| 7,726,532 B2 | 6/2010 | Gonoe |
| 7,749,809 B2 | 7/2010 | How et al. |
| 7,763,559 B2 | 7/2010 | Kurachi et al. |
| 7,772,115 B2 | 8/2010 | Hiatt |
| 7,777,275 B2 | 8/2010 | Lee |
| 7,836,727 B2 | 11/2010 | Nishiyama |
| 7,880,117 B2 | 2/2011 | Li et al. |
| 7,981,810 B1 | 7/2011 | Subramonium et al. |
| 7,994,503 B2 | 8/2011 | Hino et al. |
| 8,007,913 B2 | 8/2011 | Coppola et al. |
| 8,021,950 B1 | 9/2011 | Abadeer et al. |

(56) References Cited

U.S. PATENT DOCUMENTS

| | | | |
|---|---|---|---|
| 8,104,385 B2 | 1/2012 | Hayashi et al. |
| 8,118,971 B2 | 2/2012 | Hori et al. |
| 8,119,462 B2 | 2/2012 | Takasawa et al. |
| 8,132,427 B2 | 3/2012 | Brown et al. |
| 8,163,649 B2 | 4/2012 | Koike et al. |
| 8,168,514 B2 | 5/2012 | Garner et al. |
| 8,245,539 B2 | 8/2012 | Lu et al. |
| 8,245,540 B2 | 8/2012 | Abramov et al. |
| 8,257,603 B2 | 9/2012 | Logunov et al. |
| 8,269,138 B2 | 9/2012 | Garner et al. |
| 8,283,595 B2 | 10/2012 | Fukuyo et al. |
| 8,292,141 B2 | 10/2012 | Cox et al. |
| 8,296,066 B2 | 10/2012 | Zhao et al. |
| 8,303,754 B2 | 11/2012 | Higuchi |
| 8,307,672 B2 | 11/2012 | Hidaka et al. |
| 8,327,666 B2 | 12/2012 | Harvey et al. |
| 8,338,957 B2 | 12/2012 | Nilsson |
| 8,341,976 B2 | 1/2013 | Dejneka et al. |
| 8,347,651 B2 | 1/2013 | Abramov et al. |
| 8,358,888 B2 | 1/2013 | Ramachandran |
| 8,384,083 B2 | 2/2013 | Mori et al. |
| 8,411,459 B2 | 4/2013 | Yu et al. |
| 8,444,906 B2 | 5/2013 | Lee et al. |
| 8,448,471 B2 | 5/2013 | Kumatani et al. |
| 8,455,378 B2 | 6/2013 | Yanase et al. |
| 8,482,189 B2 | 7/2013 | Goto et al. |
| 8,518,280 B2 | 8/2013 | Hsu et al. |
| 8,531,679 B2 | 9/2013 | Scheiner |
| 8,533,942 B2 | 9/2013 | Ohashi et al. |
| 8,535,997 B2 | 9/2013 | Kawakami et al. |
| 8,549,881 B2 | 10/2013 | Brown et al. |
| 8,584,354 B2 | 11/2013 | Cornejo et al. |
| 8,584,490 B2 | 11/2013 | Garner et al. |
| 8,592,716 B2 | 11/2013 | Abramov et al. |
| 8,604,380 B2 | 12/2013 | Howerton et al. |
| 8,607,590 B2 | 12/2013 | Glaesemann et al. |
| 8,616,024 B2 | 12/2013 | Cornejo et al. |
| 8,635,887 B2 | 1/2014 | Black et al. |
| 8,643,129 B2 | 2/2014 | Laming et al. |
| 8,670,182 B2 | 3/2014 | Tanida et al. |
| 8,680,489 B2 | 3/2014 | Martinez et al. |
| 8,685,838 B2 | 4/2014 | Fukuyo et al. |
| 8,697,228 B2 | 4/2014 | Carre et al. |
| 8,699,037 B2 | 4/2014 | Cox |
| 8,720,228 B2 | 5/2014 | Li |
| 8,742,588 B2 | 6/2014 | Nilsson et al. |
| 8,796,165 B2 | 8/2014 | Ellison et al. |
| 8,826,696 B2 | 9/2014 | Brown et al. |
| 8,835,335 B2 | 9/2014 | Murata et al. |
| 8,852,698 B2 | 10/2014 | Fukumitsu |
| 8,871,641 B2 | 10/2014 | Nilsson |
| 8,873,067 B2 | 10/2014 | Lee et al. |
| 8,887,529 B2 | 11/2014 | Lu et al. |
| 8,916,798 B2 | 12/2014 | Pluss |
| 8,943,855 B2 | 2/2015 | Gomez et al. |
| 8,971,053 B2 | 3/2015 | Kariya et al. |
| 8,980,727 B1 | 3/2015 | Lei et al. |
| 8,993,465 B2 | 3/2015 | Ellison et al. |
| 8,999,179 B2 | 4/2015 | Yu et al. |
| 9,023,421 B2 | 5/2015 | Nakashima |
| 9,024,443 B2 | 5/2015 | Inaba et al. |
| 9,093,381 B2 | 7/2015 | Barriere et al. |
| 9,138,913 B2 | 9/2015 | Arai et al. |
| 9,140,539 B2 | 9/2015 | Scheiner |
| 9,227,868 B2 | 1/2016 | Matsumoto et al. |
| 9,232,652 B2 | 1/2016 | Fushie et al. |
| 9,263,300 B2 | 2/2016 | Tsai et al. |
| 9,278,886 B2 | 3/2016 | Boek et al. |
| 9,285,593 B1 | 3/2016 | Laskin et al. |
| 9,290,407 B2 | 3/2016 | Barefoot et al. |
| 9,296,066 B2 | 3/2016 | Hosseini et al. |
| 9,296,646 B2 | 3/2016 | Burket et al. |
| 9,305,470 B2 | 4/2016 | Miki et al. |
| 9,321,680 B2 | 4/2016 | Chuang et al. |
| 9,324,791 B2 | 4/2016 | Tamemoto |
| 9,327,381 B2 | 5/2016 | Lee et al. |
| 9,346,706 B2 | 5/2016 | Bazemore et al. |
| 9,377,583 B2 | 6/2016 | Giaretta et al. |
| 9,425,125 B2 | 8/2016 | Shen |
| 9,442,377 B1 | 9/2016 | Ongayi et al. |
| 9,446,590 B2 | 9/2016 | Chen et al. |
| 9,481,598 B2 | 11/2016 | Bergh et al. |
| 9,517,963 B2 | 12/2016 | Marjanovic et al. |
| 9,676,046 B2 | 6/2017 | Hamada et al. |
| 9,745,220 B2 | 8/2017 | Burket et al. |
| 9,758,876 B2 | 9/2017 | Shorey et al. |
| 9,760,986 B2 | 9/2017 | Ramamurthy et al. |
| 9,815,730 B2 | 11/2017 | Marjanovic et al. |
| 9,832,868 B1 | 11/2017 | Wright et al. |
| 9,850,160 B2 | 12/2017 | Marjanovic et al. |
| 9,953,912 B2 | 4/2018 | Goers |
| 10,144,093 B2 | 12/2018 | Marjanovic et al. |
| 10,203,476 B2 | 2/2019 | Cui |
| 2001/0009250 A1 | 7/2001 | Herman et al. |
| 2002/0005805 A1 | 1/2002 | Ogura et al. |
| 2002/0041946 A1 | 4/2002 | Abe |
| 2002/0046997 A1 | 4/2002 | Nam et al. |
| 2002/0051563 A1 | 5/2002 | Goto et al. |
| 2002/0052125 A1 | 5/2002 | Shaffer et al. |
| 2002/0062563 A1 | 5/2002 | Koide et al. |
| 2002/0082466 A1 | 6/2002 | Han |
| 2002/0097486 A1 | 7/2002 | Yamaguchi et al. |
| 2002/0110639 A1 | 8/2002 | Bruns |
| 2002/0137344 A1 | 9/2002 | Jordan et al. |
| 2002/0180015 A1 | 12/2002 | Yamaguchi et al. |
| 2002/0182871 A1 | 12/2002 | Lu et al. |
| 2003/0006221 A1 | 1/2003 | Hong et al. |
| 2003/0007772 A1 | 1/2003 | Borrelli et al. |
| 2003/0045420 A1 | 3/2003 | Koyama et al. |
| 2003/0137056 A1 | 7/2003 | Taniguchi et al. |
| 2003/0150839 A1 | 8/2003 | Kobayashi et al. |
| 2003/0206651 A1 | 11/2003 | Goto et al. |
| 2003/0217568 A1 | 11/2003 | Koyo et al. |
| 2003/0235385 A1 | 12/2003 | Taylor et al. |
| 2004/0000534 A1 | 1/2004 | Lipinski |
| 2004/0013951 A1 | 1/2004 | Wang |
| 2004/0022487 A1 | 2/2004 | Nagasaka et al. |
| 2004/0058476 A1 | 3/2004 | Enquist et al. |
| 2004/0061705 A1 | 4/2004 | Yoon et al. |
| 2004/0092105 A1 | 5/2004 | Lee et al. |
| 2004/0094524 A1 | 5/2004 | Stevens |
| 2004/0152229 A1 | 8/2004 | Najafi et al. |
| 2004/0188393 A1 | 9/2004 | Li et al. |
| 2004/0214423 A1 | 10/2004 | Marxsen et al. |
| 2004/0217455 A1 | 11/2004 | Shiono et al. |
| 2004/0221615 A1 | 11/2004 | Postupack et al. |
| 2004/0223704 A1 | 11/2004 | Fujii et al. |
| 2004/0256619 A1 | 12/2004 | Nomura et al. |
| 2005/0009315 A1 | 1/2005 | Kim et al. |
| 2005/0023246 A1* | 2/2005 | McEntee .............. B24B 1/04 216/83 |
| 2005/0024743 A1 | 2/2005 | Camy-Peyret |
| 2005/0029238 A1 | 2/2005 | Chen |
| 2005/0033184 A1 | 2/2005 | Christoph |
| 2005/0079650 A1 | 4/2005 | Mancini et al. |
| 2005/0098458 A1 | 5/2005 | Gruetzmacher et al. |
| 2005/0098548 A1 | 5/2005 | Kobayashi et al. |
| 2005/0106874 A1* | 5/2005 | Matsui .......... H01L 21/31058 438/689 |
| 2005/0112506 A1 | 5/2005 | Czech et al. |
| 2005/0115938 A1 | 6/2005 | Sawaki et al. |
| 2005/0142364 A1 | 6/2005 | Aitken |
| 2005/0142812 A1 | 6/2005 | Kurosawa |
| 2005/0158538 A1 | 7/2005 | Li et al. |
| 2005/0202683 A1 | 9/2005 | Wang et al. |
| 2005/0266320 A1 | 12/2005 | Amemiya |
| 2005/0274690 A1 | 12/2005 | Park et al. |
| 2005/0274702 A1 | 12/2005 | Deshi |
| 2006/0011593 A1 | 1/2006 | Fukuyo et al. |
| 2006/0012766 A1 | 1/2006 | Klosner et al. |
| 2006/0019814 A1 | 1/2006 | Baik et al. |
| 2006/0039160 A1 | 2/2006 | Cassarly et al. |
| 2006/0109874 A1 | 5/2006 | Shiozaki et al. |
| 2006/0127679 A1 | 6/2006 | Gulati et al. |

(56) References Cited

U.S. PATENT DOCUMENTS

| | | |
|---|---|---|
| 2006/0151450 A1 | 7/2006 | You et al. |
| 2006/0192978 A1 | 8/2006 | Laguarta Bertran et al. |
| 2006/0194916 A1 | 8/2006 | Zhong et al. |
| 2006/0207976 A1 | 9/2006 | Bovatsek et al. |
| 2006/0219676 A1 | 10/2006 | Taylor et al. |
| 2006/0227440 A1 | 10/2006 | Gluckstad |
| 2006/0270232 A1 | 11/2006 | Kawamura et al. |
| 2006/0289410 A1 | 12/2006 | Morita et al. |
| 2006/0290232 A1 | 12/2006 | Fujita et al. |
| 2006/0292877 A1 | 12/2006 | Lake |
| 2007/0045779 A1 | 3/2007 | Hiatt |
| 2007/0051706 A1 | 3/2007 | Bovatsek et al. |
| 2007/0111390 A1 | 5/2007 | Komura et al. |
| 2007/0111480 A1 | 5/2007 | Maruyama et al. |
| 2007/0117044 A1 | 5/2007 | Ogihara et al. |
| 2007/0119831 A1 | 5/2007 | Kandt |
| 2007/0132977 A1 | 6/2007 | Komatsuda |
| 2007/0138151 A1 | 6/2007 | Tanaka et al. |
| 2007/0177116 A1 | 8/2007 | Amako |
| 2007/0181543 A1 | 8/2007 | Urairi et al. |
| 2007/0190340 A1 | 8/2007 | Coppola et al. |
| 2007/0202619 A1 | 8/2007 | Tamura et al. |
| 2007/0232028 A1 | 10/2007 | Lee et al. |
| 2007/0298529 A1 | 12/2007 | Maeda et al. |
| 2008/0000884 A1 | 1/2008 | Sugiura et al. |
| 2008/0099444 A1 | 5/2008 | Misawa et al. |
| 2008/0194109 A1 | 8/2008 | Ishibashi et al. |
| 2008/0206690 A1 | 8/2008 | Kennedy et al. |
| 2008/0212185 A1 | 9/2008 | Fuse |
| 2008/0245109 A1 | 10/2008 | Flemming et al. |
| 2008/0314883 A1 | 12/2008 | Juodkazis et al. |
| 2009/0013724 A1 | 1/2009 | Koyo et al. |
| 2009/0029189 A1 | 1/2009 | Moriwaki et al. |
| 2009/0032510 A1 | 2/2009 | Ando et al. |
| 2009/0075087 A1 | 3/2009 | Xu et al. |
| 2009/0098351 A1 | 4/2009 | Kishi |
| 2009/0151996 A1 | 6/2009 | Mishima et al. |
| 2009/0176034 A1 | 7/2009 | Ruuttu et al. |
| 2009/0183764 A1 | 7/2009 | Meyer |
| 2009/0219491 A1 | 9/2009 | Williams et al. |
| 2009/0242528 A1 | 10/2009 | Howerton et al. |
| 2009/0250446 A1 | 10/2009 | Sakamoto |
| 2009/0286091 A1 | 11/2009 | Danielson et al. |
| 2009/0294419 A1 | 12/2009 | Abramov et al. |
| 2009/0294422 A1 | 12/2009 | Lubatschowski et al. |
| 2009/0324899 A1 | 12/2009 | Feinstein et al. |
| 2010/0000259 A1 | 1/2010 | Ukrainczyk et al. |
| 2010/0015439 A1 | 1/2010 | Buether et al. |
| 2010/0015454 A1 | 1/2010 | Anderson et al. |
| 2010/0025387 A1 | 2/2010 | Arai et al. |
| 2010/0029460 A1 | 2/2010 | Shojiya et al. |
| 2010/0032087 A1 | 2/2010 | Takahashi et al. |
| 2010/0050692 A1 | 3/2010 | Logunov et al. |
| 2010/0068453 A1 | 3/2010 | Imai et al. |
| 2010/0080961 A1 | 4/2010 | Okamura et al. |
| 2010/0086741 A1 | 4/2010 | Bovatsek et al. |
| 2010/0086870 A1 | 4/2010 | Ogihara et al. |
| 2010/0089631 A1 | 4/2010 | Sakaguchi et al. |
| 2010/0089882 A1 | 4/2010 | Tamura |
| 2010/0102042 A1 | 4/2010 | Garner et al. |
| 2010/0119808 A1 | 5/2010 | Li et al. |
| 2010/0119846 A1 | 5/2010 | Sawada |
| 2010/0129603 A1 | 5/2010 | Blick et al. |
| 2010/0133697 A1 | 6/2010 | Nilsson |
| 2010/0147813 A1 | 6/2010 | Lei et al. |
| 2010/0178732 A1 | 7/2010 | Wu et al. |
| 2010/0206008 A1 | 8/2010 | Harvey et al. |
| 2010/0252540 A1 | 10/2010 | Lei et al. |
| 2010/0252959 A1 | 10/2010 | Lei et al. |
| 2010/0276505 A1 | 11/2010 | Smith |
| 2010/0279067 A1 | 11/2010 | Sabia et al. |
| 2010/0279509 A1 | 11/2010 | Kim et al. |
| 2010/0284027 A1 | 11/2010 | Scheiner |
| 2010/0287991 A1 | 11/2010 | Brown et al. |
| 2010/0289115 A1 | 11/2010 | Akiyama et al. |
| 2010/0289186 A1 | 11/2010 | Longo et al. |
| 2010/0291353 A1 | 11/2010 | Dejneka et al. |
| 2010/0292068 A1 | 11/2010 | Takaya et al. |
| 2010/0307809 A1 | 12/2010 | Noda et al. |
| 2010/0320179 A1 | 12/2010 | Morita et al. |
| 2010/0326138 A1 | 12/2010 | Kumatani et al. |
| 2011/0003619 A1 | 1/2011 | Fujii |
| 2011/0032467 A1 | 2/2011 | Koike |
| 2011/0045239 A1 | 2/2011 | Takaya et al. |
| 2011/0049764 A1 | 3/2011 | Lee et al. |
| 2011/0049765 A1 | 3/2011 | Li et al. |
| 2011/0088324 A1 | 4/2011 | Wessel |
| 2011/0100401 A1 | 5/2011 | Fiorentini |
| 2011/0123787 A1 | 5/2011 | Tomamoto et al. |
| 2011/0132881 A1 | 6/2011 | Liu |
| 2011/0132883 A1 | 6/2011 | Sheng et al. |
| 2011/0183116 A1 | 7/2011 | Hung et al. |
| 2011/0187025 A1 | 8/2011 | Costin, Sr. |
| 2011/0189847 A1 | 8/2011 | Tsai et al. |
| 2011/0195360 A1 | 8/2011 | Flemming et al. |
| 2011/0201197 A1 | 8/2011 | Nilsson et al. |
| 2011/0204528 A1 | 8/2011 | Matsutani et al. |
| 2011/0229687 A1 | 9/2011 | Gu et al. |
| 2011/0240611 A1 | 10/2011 | Torbjoern |
| 2011/0248405 A1 | 10/2011 | Li et al. |
| 2011/0256344 A1 | 10/2011 | Ono et al. |
| 2011/0259373 A1 | 10/2011 | Hotta et al. |
| 2011/0259860 A1 | 10/2011 | Bass et al. |
| 2011/0277507 A1 | 11/2011 | Lu et al. |
| 2011/0300908 A1 | 12/2011 | Grespan et al. |
| 2011/0308942 A1 | 12/2011 | Liu et al. |
| 2011/0316561 A1 | 12/2011 | Tinsley et al. |
| 2011/0318555 A1 | 12/2011 | Bookbinder et al. |
| 2011/0318561 A1 | 12/2011 | Murata et al. |
| 2012/0013196 A1 | 1/2012 | Kim et al. |
| 2012/0017642 A1 | 1/2012 | Teranishi et al. |
| 2012/0047951 A1 | 3/2012 | Dannoux et al. |
| 2012/0047956 A1 | 3/2012 | Li |
| 2012/0048604 A1 | 3/2012 | Cornejo et al. |
| 2012/0050692 A1 | 3/2012 | Gollier |
| 2012/0052302 A1 | 3/2012 | Matusick et al. |
| 2012/0061440 A1 | 3/2012 | Roell |
| 2012/0064306 A1 | 3/2012 | Kang et al. |
| 2012/0092681 A1 | 4/2012 | Cox |
| 2012/0103018 A1 | 5/2012 | Lu et al. |
| 2012/0105095 A1 | 5/2012 | Bryant et al. |
| 2012/0111057 A1 | 5/2012 | Barefoot et al. |
| 2012/0125892 A1 | 5/2012 | Shimoi et al. |
| 2012/0125893 A1 | 5/2012 | Shimoi et al. |
| 2012/0129359 A1 | 5/2012 | Shimoi et al. |
| 2012/0130004 A1 | 5/2012 | Xu et al. |
| 2012/0131958 A1 | 5/2012 | Shimoi et al. |
| 2012/0131962 A1 | 5/2012 | Mitsugi et al. |
| 2012/0135177 A1 | 5/2012 | Cornejo et al. |
| 2012/0135195 A1 | 5/2012 | Glaesemann et al. |
| 2012/0135607 A1 | 5/2012 | Shimoi et al. |
| 2012/0135608 A1 | 5/2012 | Shimoi et al. |
| 2012/0135852 A1 | 5/2012 | Ellison et al. |
| 2012/0135853 A1 | 5/2012 | Amin et al. |
| 2012/0141668 A1 | 6/2012 | Nakashima |
| 2012/0142136 A1 | 6/2012 | Horning et al. |
| 2012/0145331 A1 | 6/2012 | Gomez et al. |
| 2012/0168412 A1 | 7/2012 | Hooper |
| 2012/0196071 A1 | 8/2012 | Cornejo et al. |
| 2012/0205356 A1 | 8/2012 | Pluess |
| 2012/0211923 A1 | 8/2012 | Garner et al. |
| 2012/0214006 A1 | 8/2012 | Chen et al. |
| 2012/0234049 A1 | 9/2012 | Bolton |
| 2012/0234807 A1 | 9/2012 | Sercel et al. |
| 2012/0235969 A1 | 9/2012 | Burns et al. |
| 2012/0241919 A1 | 9/2012 | Mitani |
| 2012/0255935 A1 | 10/2012 | Kakui et al. |
| 2012/0261697 A1 | 10/2012 | Margalit et al. |
| 2012/0276483 A1 | 11/2012 | Ogihara et al. |
| 2012/0276743 A1 | 11/2012 | Won et al. |
| 2012/0299203 A1 | 11/2012 | Sugo et al. |
| 2012/0299219 A1 | 11/2012 | Shimoi et al. |
| 2012/0302139 A1 | 11/2012 | Darcangelo et al. |
| 2012/0308803 A1 | 12/2012 | Dejneka et al. |

(56) References Cited

U.S. PATENT DOCUMENTS

| | | |
|---|---|---|
| 2013/0019637 A1 | 1/2013 | Sol et al. |
| 2013/0029092 A1 | 1/2013 | Wakioka |
| 2013/0034688 A1 | 2/2013 | Koike et al. |
| 2013/0044371 A1 | 2/2013 | Rupp et al. |
| 2013/0050226 A1 | 2/2013 | Shenoy et al. |
| 2013/0061636 A1 | 3/2013 | Imai et al. |
| 2013/0068736 A1 | 3/2013 | Mielke et al. |
| 2013/0075480 A1 | 3/2013 | Yokogi et al. |
| 2013/0078891 A1 | 3/2013 | Lee et al. |
| 2013/0089701 A1 | 4/2013 | Hooper et al. |
| 2013/0091897 A1 | 4/2013 | Fujii et al. |
| 2013/0105213 A1 | 5/2013 | Hu et al. |
| 2013/0118793 A1 | 5/2013 | Teshima et al. |
| 2013/0122264 A1 | 5/2013 | Fujii et al. |
| 2013/0126573 A1 | 5/2013 | Hosseini et al. |
| 2013/0129947 A1 | 5/2013 | Harvey et al. |
| 2013/0133367 A1 | 5/2013 | Abramov et al. |
| 2013/0135745 A1 | 5/2013 | Tanida et al. |
| 2013/0143416 A1 | 6/2013 | Norval |
| 2013/0149434 A1 | 6/2013 | Oh et al. |
| 2013/0149494 A1 | 6/2013 | Koike et al. |
| 2013/0163801 A1 | 6/2013 | Ha et al. |
| 2013/0167590 A1 | 7/2013 | Teranishi et al. |
| 2013/0174607 A1 | 7/2013 | Wootton et al. |
| 2013/0174610 A1 | 7/2013 | Teranishi et al. |
| 2013/0180285 A1 | 7/2013 | Kariya |
| 2013/0180665 A2 | 7/2013 | Gomez et al. |
| 2013/0189806 A1 | 7/2013 | Hoshino |
| 2013/0192305 A1 | 8/2013 | Black et al. |
| 2013/0193585 A1 | 8/2013 | Lin et al. |
| 2013/0205835 A1 | 8/2013 | Giaretta et al. |
| 2013/0209731 A1 | 8/2013 | Nattermann et al. |
| 2013/0210245 A1 | 8/2013 | Jackl |
| 2013/0213467 A1 | 8/2013 | Nattermann et al. |
| 2013/0220982 A1 | 8/2013 | Thomas et al. |
| 2013/0221053 A1 | 8/2013 | Zhang |
| 2013/0224439 A1 | 8/2013 | Zhang et al. |
| 2013/0224492 A1 | 8/2013 | Bookbinder et al. |
| 2013/0228918 A1 | 9/2013 | Chen et al. |
| 2013/0247615 A1 | 9/2013 | Boek et al. |
| 2013/0255779 A1 | 10/2013 | Aitken et al. |
| 2013/0266757 A1 | 10/2013 | Giron et al. |
| 2013/0270240 A1 | 10/2013 | Kondo |
| 2013/0280495 A1 | 10/2013 | Matsumoto |
| 2013/0288010 A1 | 10/2013 | Akarapu et al. |
| 2013/0291598 A1 | 11/2013 | Saito et al. |
| 2013/0312460 A1 | 11/2013 | Kunishi et al. |
| 2013/0323469 A1 | 12/2013 | Abramov et al. |
| 2013/0330515 A1 | 12/2013 | Oh et al. |
| 2013/0334185 A1 | 12/2013 | Nomaru |
| 2013/0337599 A1 | 12/2013 | Yun |
| 2013/0340480 A1 | 12/2013 | Nattermann et al. |
| 2014/0015121 A1 | 1/2014 | Koizumi et al. |
| 2014/0027951 A1 | 1/2014 | Srinivas et al. |
| 2014/0034374 A1 | 2/2014 | Cornejo et al. |
| 2014/0034730 A1 | 2/2014 | Gun-Hong |
| 2014/0042202 A1 | 2/2014 | Lee |
| 2014/0044143 A1 | 2/2014 | Clarkson et al. |
| 2014/0047957 A1 | 2/2014 | Wu |
| 2014/0054618 A1 | 2/2014 | Li |
| 2014/0102146 A1 | 4/2014 | Saito et al. |
| 2014/0110040 A1 | 4/2014 | Cok |
| 2014/0113797 A1 | 4/2014 | Yamada et al. |
| 2014/0116091 A1 | 5/2014 | Chuang et al. |
| 2014/0133119 A1 | 5/2014 | Kariya et al. |
| 2014/0141217 A1 | 5/2014 | Gulati et al. |
| 2014/0147623 A1 | 5/2014 | Shorey et al. |
| 2014/0147624 A1 | 5/2014 | Streltsov et al. |
| 2014/0154439 A1 | 6/2014 | Demartino et al. |
| 2014/0165652 A1 | 6/2014 | Saito |
| 2014/0166199 A1 | 6/2014 | Bellman et al. |
| 2014/0170378 A1 | 6/2014 | Bellman et al. |
| 2014/0174131 A1 | 6/2014 | Saito et al. |
| 2014/0199519 A1 | 7/2014 | Schillinger et al. |
| 2014/0216108 A1 | 8/2014 | Wiegel et al. |
| 2014/0231390 A1 | 8/2014 | Nukaga et al. |
| 2014/0235796 A1 | 8/2014 | Ogihara et al. |
| 2014/0242375 A1 | 8/2014 | Mauro et al. |
| 2014/0254004 A1 | 9/2014 | Wooder et al. |
| 2014/0290310 A1 | 10/2014 | Green |
| 2014/0300728 A1 | 10/2014 | Drescher et al. |
| 2014/0312506 A1 | 10/2014 | Hayashi et al. |
| 2014/0320947 A1 | 10/2014 | Egerton et al. |
| 2014/0333929 A1 | 11/2014 | Sung et al. |
| 2014/0339207 A1 | 11/2014 | Sugiyama et al. |
| 2014/0340730 A1 | 11/2014 | Bergh et al. |
| 2014/0342897 A1 | 11/2014 | Amin et al. |
| 2014/0347083 A1 | 11/2014 | Bryant et al. |
| 2014/0361463 A1 | 12/2014 | Desimone et al. |
| 2014/0376006 A1 | 12/2014 | Scheiner |
| 2015/0021513 A1* | 1/2015 | Kim .............. H01L 21/32139 |
| | | 252/79.4 |
| 2015/0027757 A1 | 1/2015 | Shin et al. |
| 2015/0036065 A1 | 2/2015 | Yousefpor et al. |
| 2015/0037553 A1 | 2/2015 | Mauro |
| 2015/0038313 A1 | 2/2015 | Hosseini |
| 2015/0051060 A1 | 2/2015 | Ellison et al. |
| 2015/0054136 A1 | 2/2015 | Ebefors et al. |
| 2015/0060402 A1 | 3/2015 | Burkett et al. |
| 2015/0075221 A1 | 3/2015 | Kawaguchi et al. |
| 2015/0075222 A1 | 3/2015 | Mader |
| 2015/0093908 A1 | 4/2015 | Reddy et al. |
| 2015/0102498 A1 | 4/2015 | Enicks et al. |
| 2015/0110442 A1 | 4/2015 | Zimmel et al. |
| 2015/0118522 A1 | 4/2015 | Hosseini |
| 2015/0136743 A1 | 5/2015 | Hosseini |
| 2015/0140241 A1 | 5/2015 | Hosseini |
| 2015/0140299 A1 | 5/2015 | Ellison et al. |
| 2015/0151380 A1 | 6/2015 | Hosseini |
| 2015/0158120 A1 | 6/2015 | Courvoisier et al. |
| 2015/0165548 A1 | 6/2015 | Marjanovic et al. |
| 2015/0165560 A1 | 6/2015 | Hackert et al. |
| 2015/0165562 A1 | 6/2015 | Marjanovic et al. |
| 2015/0165563 A1 | 6/2015 | Manley et al. |
| 2015/0166391 A1 | 6/2015 | Marjanovic et al. |
| 2015/0166393 A1 | 6/2015 | Marjanovic et al. |
| 2015/0166394 A1 | 6/2015 | Marjanovic et al. |
| 2015/0166395 A1 | 6/2015 | Marjanovic et al. |
| 2015/0166396 A1 | 6/2015 | Marjanovic et al. |
| 2015/0166397 A1 | 6/2015 | Marjanovic et al. |
| 2015/0173191 A1 | 6/2015 | Takahashi |
| 2015/0183679 A1 | 7/2015 | Saito |
| 2015/0232369 A1 | 8/2015 | Marjanovic et al. |
| 2015/0239775 A1 | 8/2015 | Amin et al. |
| 2015/0274583 A1 | 10/2015 | An et al. |
| 2015/0299018 A1 | 10/2015 | Bhuyan et al. |
| 2015/0306847 A1 | 10/2015 | Bellman et al. |
| 2015/0329415 A1 | 11/2015 | Bellman et al. |
| 2015/0360991 A1 | 12/2015 | Grundmueller et al. |
| 2015/0367442 A1 | 12/2015 | Bovatsek et al. |
| 2015/0368145 A1 | 12/2015 | Senshu et al. |
| 2015/0376050 A1 | 12/2015 | Nakamura et al. |
| 2016/0008927 A1 | 1/2016 | Grundmueller et al. |
| 2016/0009066 A1 | 1/2016 | Nieber et al. |
| 2016/0023922 A1 | 1/2016 | Addiego et al. |
| 2016/0026842 A1 | 1/2016 | Withers et al. |
| 2016/0031745 A1 | 2/2016 | Ortner et al. |
| 2016/0035587 A1 | 2/2016 | Keech et al. |
| 2016/0059359 A1 | 3/2016 | Krueger et al. |
| 2016/0060156 A1 | 3/2016 | Krueger et al. |
| 2016/0102009 A1 | 4/2016 | Boek et al. |
| 2016/0107925 A1 | 4/2016 | Burket et al. |
| 2016/0145149 A1 | 5/2016 | Burket et al. |
| 2016/0152516 A1 | 6/2016 | Bazemore et al. |
| 2016/0166395 A9 | 6/2016 | Weiman |
| 2016/0199944 A1 | 7/2016 | Hosseini |
| 2016/0200621 A1 | 7/2016 | N'Gom et al. |
| 2016/0201474 A1 | 7/2016 | Slavens et al. |
| 2016/0204126 A1 | 7/2016 | Amano |
| 2016/0208387 A1 | 7/2016 | Liu et al. |
| 2016/0219704 A1 | 7/2016 | Vandemeer et al. |
| 2016/0237571 A1 | 8/2016 | Liu et al. |
| 2016/0280580 A1 | 9/2016 | Bohme |
| 2016/0282584 A1 | 9/2016 | Cui |

(56) References Cited

U.S. PATENT DOCUMENTS

| | | | |
|---|---|---|---|
| 2016/0289669 A1 | 10/2016 | Fan et al. |
| 2016/0290791 A1 | 10/2016 | Buono et al. |
| 2016/0305764 A1 | 10/2016 | Cui et al. |
| 2016/0311717 A1 | 10/2016 | Nieber et al. |
| 2016/0312365 A1 | 10/2016 | Cordonier et al. |
| 2016/0322291 A1 | 11/2016 | Goers |
| 2016/0327744 A1 | 11/2016 | Giaretta et al. |
| 2016/0334203 A1 | 11/2016 | Cui et al. |
| 2016/0351410 A1 | 12/2016 | Fu et al. |
| 2016/0352023 A1 | 12/2016 | Dang et al. |
| 2016/0362331 A1* | 12/2016 | Castle | C03C 15/00 |
| 2016/0365275 A1 | 12/2016 | Chang et al. |
| 2016/0368100 A1 | 12/2016 | Marjanovic et al. |
| 2016/0376186 A1 | 12/2016 | Gross |
| 2017/0002601 A1 | 1/2017 | Bergh et al. |
| 2017/0008122 A1 | 1/2017 | Wieland et al. |
| 2017/0011914 A1 | 1/2017 | Sumant et al. |
| 2017/0029957 A1 | 2/2017 | Moon et al. |
| 2017/0036419 A1 | 2/2017 | Adib et al. |
| 2017/0103249 A1 | 4/2017 | Jin et al. |
| 2017/0119891 A1* | 5/2017 | Lal | A61K 47/6925 |
| 2017/0160077 A1 | 6/2017 | Featherstone et al. |
| 2017/0169847 A1 | 6/2017 | Tamaki |
| 2017/0228884 A1 | 8/2017 | Yoshida |
| 2017/0252859 A1 | 9/2017 | Kumkar et al. |
| 2017/0276951 A1 | 9/2017 | Kumkar et al. |
| 2017/0358447 A1 | 12/2017 | Tsunetomo et al. |
| 2017/0363417 A1 | 12/2017 | Cui et al. |
| 2017/0372899 A1 | 12/2017 | Yang et al. |
| 2018/0005922 A1 | 1/2018 | Levesque, Jr. et al. |
| 2018/0033128 A1 | 2/2018 | Sobieranski et al. |
| 2018/0057390 A1 | 3/2018 | Hackert et al. |
| 2018/0062342 A1 | 3/2018 | Comstock, II et al. |
| 2018/0068868 A1 | 3/2018 | Jaramillo et al. |
| 2018/0093914 A1 | 4/2018 | Akarapu et al. |
| 2018/0215647 A1 | 8/2018 | Ortner et al. |
| 2018/0340262 A1* | 11/2018 | Hiranuma | C23F 1/16 |
| 2018/0342450 A1 | 11/2018 | Huang et al. |
| 2018/0342451 A1 | 11/2018 | Dahlberg et al. |
| 2019/0012514 A1 | 1/2019 | Jin et al. |
| 2019/0185373 A1 | 6/2019 | Hu et al. |
| 2020/0156990 A1 | 5/2020 | Sakade et al. |

FOREIGN PATENT DOCUMENTS

| | | |
|---|---|---|
| CA | 2530607 A1 | 4/2005 |
| CN | 1096936 A | 1/1995 |
| CN | 1196562 A | 10/1998 |
| CN | 2388062 Y | 7/2000 |
| CN | 1473087 A | 2/2004 |
| CN | 1485812 A | 3/2004 |
| CN | 1200793 C | 5/2005 |
| CN | 1619778 A | 5/2005 |
| CN | 1636912 A | 7/2005 |
| CN | 1735568 A | 2/2006 |
| CN | 1761378 A | 4/2006 |
| CN | 1845812 A | 10/2006 |
| CN | 1283409 C | 11/2006 |
| CN | 1967815 A | 5/2007 |
| CN | 101048255 A | 10/2007 |
| CN | 101238572 A | 8/2008 |
| CN | 101386466 A | 3/2009 |
| CN | 101427427 A | 5/2009 |
| CN | 101438397 A | 5/2009 |
| CN | 100494879 C | 6/2009 |
| CN | 101502914 A | 8/2009 |
| CN | 100546004 C | 9/2009 |
| CN | 100555601 C | 10/2009 |
| CN | 101602148 A | 12/2009 |
| CN | 101610870 A | 12/2009 |
| CN | 201357287 Y | 12/2009 |
| CN | 101631739 A | 1/2010 |
| CN | 101637849 A | 2/2010 |
| CN | 201471092 U | 5/2010 |
| CN | 101722367 A | 6/2010 |
| CN | 101862907 A | 10/2010 |
| CN | 101965242 A | 2/2011 |
| CN | 102046545 A | 5/2011 |
| CN | 102060437 A | 5/2011 |
| CN | 102246292 A | 11/2011 |
| CN | 102304323 A | 1/2012 |
| CN | 102319960 A | 1/2012 |
| CN | 102326232 A | 1/2012 |
| CN | 102343631 A | 2/2012 |
| CN | 102356049 A | 2/2012 |
| CN | 102356050 A | 2/2012 |
| CN | 102428047 A | 4/2012 |
| CN | 102485405 A | 6/2012 |
| CN | 102540474 A | 7/2012 |
| CN | 102574246 A | 7/2012 |
| CN | 102585696 A | 7/2012 |
| CN | 102596830 A | 7/2012 |
| CN | 102649199 A | 8/2012 |
| CN | 102672355 A | 9/2012 |
| CN | 102795596 A | 11/2012 |
| CN | 102898014 A | 1/2013 |
| CN | 102916081 A | 2/2013 |
| CN | 102923939 A | 2/2013 |
| CN | 103013374 A | 4/2013 |
| CN | 103079747 A | 5/2013 |
| CN | 103143841 A | 6/2013 |
| CN | 103159401 A | 6/2013 |
| CN | 203021443 U | 6/2013 |
| CN | 103237771 A | 8/2013 |
| CN | 103273195 A | 9/2013 |
| CN | 103316990 A | 9/2013 |
| CN | 103359947 A | 10/2013 |
| CN | 103359948 A | 10/2013 |
| CN | 103460368 A | 12/2013 |
| CN | 103531414 A | 1/2014 |
| CN | 103534216 A | 1/2014 |
| CN | 102300820 B | 2/2014 |
| CN | 103746027 A | 4/2014 |
| CN | 203509350 U | 4/2014 |
| CN | 104344202 A | 2/2015 |
| CN | 102958642 B | 7/2015 |
| CN | 104897062 A | 9/2015 |
| CN | 105246850 A | 1/2016 |
| CN | 105392593 A | 3/2016 |
| CN | 105693102 A | 6/2016 |
| CN | 106132627 A | 11/2016 |
| CN | 108191258 A | 6/2018 |
| DE | 2231330 A1 | 1/1974 |
| DE | 10322376 A1 | 12/2004 |
| DE | 102006035555 A1 | 1/2008 |
| DE | 102010003817 A1 | 10/2011 |
| DE | 102011000768 A1 | 8/2012 |
| DE | 102012010635 A1 | 11/2013 |
| DE | 102012110971 A1 | 5/2014 |
| DE | 102013103370 A1 | 10/2014 |
| DE | 102013223637 A1 | 5/2015 |
| DE | 102014113339 A1 | 3/2016 |
| EP | 247993 A1 | 12/1987 |
| EP | 0270897 A1 | 6/1988 |
| EP | 280918 A2 | 9/1988 |
| EP | 0393381 A2 | 10/1990 |
| EP | 0938946 A1 | 9/1999 |
| EP | 1043110 A2 | 10/2000 |
| EP | 1159104 A1 | 12/2001 |
| EP | 1164113 A1 | 12/2001 |
| EP | 1412131 A1 | 4/2004 |
| EP | 1449810 A2 | 8/2004 |
| EP | 1609559 A1 | 12/2005 |
| EP | 1614665 A1 | 1/2006 |
| EP | 1651943 A2 | 5/2006 |
| EP | 1714730 A1 | 10/2006 |
| EP | 2020273 A2 | 2/2009 |
| EP | 2133170 A1 | 12/2009 |
| EP | 2202545 A1 | 6/2010 |
| EP | 2253414 A1 | 11/2010 |
| EP | 2398746 A1 | 12/2011 |
| EP | 2543065 A1 | 1/2013 |
| EP | 2574983 A1 | 4/2013 |
| EP | 2600397 A1 | 6/2013 |

(56) References Cited

FOREIGN PATENT DOCUMENTS

| | | |
|---|---|---|
| EP | 2754524 A1 | 7/2014 |
| EP | 2781296 A1 | 9/2014 |
| EP | 2783784 A2 | 10/2014 |
| EP | 2831913 A1 | 2/2015 |
| EP | 2859984 A2 | 4/2015 |
| EP | 2922793 A1 | 9/2015 |
| EP | 3166372 A1 | 5/2017 |
| EP | 3288906 A1 | 3/2018 |
| FR | 2989294 A1 | 10/2013 |
| GB | 1242172 A | 8/1971 |
| GB | 2481190 A | 12/2011 |
| IN | 201102390 | 3/2013 |
| JP | 55130839 A | 10/1980 |
| JP | 56-129261 A | 10/1981 |
| JP | 56160893 A | 12/1981 |
| JP | 60-220340 A | 11/1985 |
| JP | 64-077001 A | 3/1989 |
| JP | 01-179770 A | 7/1989 |
| JP | 03252384 A | 11/1991 |
| JP | 04-349132 A | 12/1992 |
| JP | 06079486 A | 3/1994 |
| JP | 06-318756 A | 11/1994 |
| JP | 09-106243 A | 4/1997 |
| JP | 10263873 A | 10/1998 |
| JP | 11-197498 A | 7/1999 |
| JP | 11-269683 A | 10/1999 |
| JP | 11297703 A | 10/1999 |
| JP | 11-330597 A | 11/1999 |
| JP | 11-347758 A | 12/1999 |
| JP | 2000-010289 A | 1/2000 |
| JP | 2000-302488 A | 10/2000 |
| JP | 2000301372 A | 10/2000 |
| JP | 2001-105398 A | 4/2001 |
| JP | 2001-106545 A | 4/2001 |
| JP | 2001-138083 A | 5/2001 |
| JP | 2002028799 A | 1/2002 |
| JP | 2002154846 A | 5/2002 |
| JP | 2002-210730 A | 7/2002 |
| JP | 2002-228818 A | 8/2002 |
| JP | 2003017503 A | 1/2003 |
| JP | 2003-062756 A | 3/2003 |
| JP | 2003-114400 A | 4/2003 |
| JP | 2003-154517 A | 5/2003 |
| JP | 2003148931 A | 5/2003 |
| JP | 2003-181668 A | 7/2003 |
| JP | 2003-197811 A | 7/2003 |
| JP | 2003-238178 A | 8/2003 |
| JP | 2004-209675 A | 7/2004 |
| JP | 2004190043 A | 7/2004 |
| JP | 2004-255562 A | 9/2004 |
| JP | 2004330236 A | 11/2004 |
| JP | 2004-351494 A | 12/2004 |
| JP | 2004363212 A | 12/2004 |
| JP | 2005-000952 A | 1/2005 |
| JP | 2005-019576 A | 1/2005 |
| JP | 2005-074663 A | 3/2005 |
| JP | 2005-104819 A | 4/2005 |
| JP | 2005-121417 A | 5/2005 |
| JP | 2005-144622 A | 6/2005 |
| JP | 2005-205440 A | 8/2005 |
| JP | 2005257339 A | 9/2005 |
| JP | 2005-279755 A | 10/2005 |
| JP | 2005-288503 A | 10/2005 |
| JP | 2005-306702 A | 11/2005 |
| JP | 2006-130691 A | 5/2006 |
| JP | 3775250 B2 | 5/2006 |
| JP | 3775410 B2 | 5/2006 |
| JP | 2006161124 A | 6/2006 |
| JP | 2006-248885 A | 9/2006 |
| JP | 3823108 B2 | 9/2006 |
| JP | 2006290630 A | 10/2006 |
| JP | 2007-021548 A | 2/2007 |
| JP | 2007042741 A | 2/2007 |
| JP | 2007067031 A | 3/2007 |
| JP | 2007-196277 A | 8/2007 |
| JP | 2007-253203 A | 10/2007 |
| JP | 2007-260896 A | 10/2007 |
| JP | 2008-094641 A | 4/2008 |
| JP | 2008-522950 A | 7/2008 |
| JP | 2008156200 A | 7/2008 |
| JP | 2008-247639 A | 10/2008 |
| JP | 2008-273783 A | 11/2008 |
| JP | 2008288577 A | 11/2008 |
| JP | 2009-200356 A | 9/2009 |
| JP | 4349132 B2 | 10/2009 |
| JP | 4418282 B2 | 2/2010 |
| JP | 2010-046761 A | 3/2010 |
| JP | 2010074017 A | 4/2010 |
| JP | 2010-539288 A | 12/2010 |
| JP | 4592855 B2 | 12/2010 |
| JP | 2011-011212 A | 1/2011 |
| JP | 2011-037707 A | 2/2011 |
| JP | 2011-049398 A | 3/2011 |
| JP | 4672689 B2 | 4/2011 |
| JP | 2011-517299 A | 6/2011 |
| JP | 2011143434 A | 7/2011 |
| JP | 2011178642 A | 9/2011 |
| JP | 2011228517 A | 11/2011 |
| JP | 2011251872 A | 12/2011 |
| JP | 2012-024782 A | 2/2012 |
| JP | 2012-031018 A | 2/2012 |
| JP | 4880820 B2 | 2/2012 |
| JP | 2012028533 A | 2/2012 |
| JP | 2012-506837 | 3/2012 |
| JP | 2012-159749 A | 8/2012 |
| JP | 2012-517957 A | 8/2012 |
| JP | 2012-187618 A | 10/2012 |
| JP | 2013-007842 A | 1/2013 |
| JP | 2013-031879 A | 2/2013 |
| JP | 2013-043808 A | 3/2013 |
| JP | 2013-075802 A | 4/2013 |
| JP | 2013-091578 A | 5/2013 |
| JP | 2013-121908 A | 6/2013 |
| JP | 5274085 B2 | 8/2013 |
| JP | 2013-178371 A | 9/2013 |
| JP | 2013-187247 A | 9/2013 |
| JP | 2013-536081 A | 9/2013 |
| JP | 5300544 B2 | 9/2013 |
| JP | 2013-203630 A | 10/2013 |
| JP | 2013-203631 A | 10/2013 |
| JP | 2013-223886 A | 10/2013 |
| JP | 5318748 B2 | 10/2013 |
| JP | 2013220958 A | 10/2013 |
| JP | 2013-245153 A | 12/2013 |
| JP | 2014-127701 A | 7/2014 |
| JP | 2015-501531 A | 1/2015 |
| JP | 2015-030040 A | 2/2015 |
| JP | 2015-129076 A | 7/2015 |
| JP | 2015-519722 A | 7/2015 |
| JP | 2015146410 A | 8/2015 |
| JP | 2016-508069 A | 3/2016 |
| KR | 1020020038707 A | 5/2002 |
| KR | 10-2002-0066005 A | 8/2002 |
| KR | 10-2009-0057161 A | 6/2009 |
| KR | 2010-0120297 A | 11/2010 |
| KR | 10-1020621 B1 | 3/2011 |
| KR | 20110046953 A | 5/2011 |
| KR | 2011-0121637 A | 11/2011 |
| KR | 10-2012-0015366 A | 2/2012 |
| KR | 10-1120471 B1 | 3/2012 |
| KR | 1159697 B1 | 6/2012 |
| KR | 10-2012-0074508 A | 7/2012 |
| KR | 2012-0102675 A | 9/2012 |
| KR | 2013-0031380 A | 3/2013 |
| KR | 10-1259349 B1 | 4/2013 |
| KR | 10-1269474 B1 | 5/2013 |
| KR | 2013-0079395 A | 7/2013 |
| KR | 10-2013-0111269 A | 10/2013 |
| KR | 10-2013-0124646 A | 11/2013 |
| KR | 10-1344368 B1 | 12/2013 |
| KR | 10-2014-0022980 A | 2/2014 |
| KR | 10-2014-0022981 A | 2/2014 |
| KR | 10-2014-0064220 A | 5/2014 |
| KR | 10-1423338 B1 | 7/2014 |

(56) References Cited

FOREIGN PATENT DOCUMENTS

| | | |
|---|---|---|
| KR | 10-2014-0112652 A | 9/2014 |
| KR | 2015-0016176 A | 2/2015 |
| TW | 200423242 A | 11/2004 |
| TW | 200842313 A | 11/2008 |
| TW | 200842345 A | 11/2008 |
| TW | 201027601 A | 7/2010 |
| TW | 201041027 A | 11/2010 |
| TW | 201212755 A | 3/2012 |
| TW | 201226345 A | 7/2012 |
| TW | 201303259 A | 1/2013 |
| TW | 201311592 A | 3/2013 |
| TW | 201317622 A | 5/2013 |
| TW | 201331136 A | 8/2013 |
| TW | 201339111 A | 10/2013 |
| TW | 201340272 A | 10/2013 |
| TW | 201429897 A | 8/2014 |
| TW | 201610602 A | 3/2016 |
| TW | 201621267 A | 6/2016 |
| WO | 8902877 A1 | 4/1989 |
| WO | 98/21154 A1 | 5/1998 |
| WO | 99/29243 A1 | 6/1999 |
| WO | 99/63900 A1 | 12/1999 |
| WO | 00/51778 A1 | 9/2000 |
| WO | 2001033621 A2 | 5/2001 |
| WO | 2002/081142 A1 | 10/2002 |
| WO | 2003/007370 A1 | 1/2003 |
| WO | 03/11522 A1 | 2/2003 |
| WO | 03021004 A1 | 3/2003 |
| WO | 2004/110693 A1 | 12/2004 |
| WO | 2005031300 A2 | 4/2005 |
| WO | 2005033033 A1 | 4/2005 |
| WO | 2005034594 A1 | 4/2005 |
| WO | 2006/073098 A1 | 7/2006 |
| WO | 2006/112822 A1 | 10/2006 |
| WO | 2007/094160 A1 | 8/2007 |
| WO | 2007/094233 A1 | 8/2007 |
| WO | 2007096958 A1 | 8/2007 |
| WO | 2008/012186 A1 | 1/2008 |
| WO | 2008/080182 A1 | 7/2008 |
| WO | 2008/102868 A1 | 8/2008 |
| WO | 2008110061 A1 | 9/2008 |
| WO | 2008/128612 A1 | 10/2008 |
| WO | 2009072810 A2 | 6/2009 |
| WO | 2009/114375 A2 | 9/2009 |
| WO | 2010/035736 A1 | 4/2010 |
| WO | 2010/096359 A1 | 8/2010 |
| WO | 2010087483 A1 | 8/2010 |
| WO | 2010/111609 A2 | 9/2010 |
| WO | 2010/129459 A2 | 11/2010 |
| WO | 2011/025908 A1 | 3/2011 |
| WO | 2011/056781 A1 | 5/2011 |
| WO | 2011109648 A1 | 9/2011 |
| WO | 2012/006736 A2 | 1/2012 |
| WO | 2012011230 A1 | 1/2012 |
| WO | 2012/027220 A2 | 3/2012 |
| WO | 2012060277 A1 | 5/2012 |
| WO | 2012/075072 A2 | 6/2012 |
| WO | 2012/108052 A1 | 8/2012 |
| WO | 2012/161317 A1 | 11/2012 |
| WO | 2012/166753 A1 | 12/2012 |
| WO | 2013/016157 A1 | 1/2013 |
| WO | 2013008344 A1 | 1/2013 |
| WO | 2013/022148 A1 | 2/2013 |
| WO | 2013/043173 A1 | 3/2013 |
| WO | 2013030848 A1 | 3/2013 |
| WO | 2013/084877 A1 | 6/2013 |
| WO | 2013/084879 A1 | 6/2013 |
| WO | 2013/134237 A1 | 9/2013 |
| WO | 2013/138802 A1 | 9/2013 |
| WO | 2013130718 A1 | 9/2013 |
| WO | 2013/147694 A1 | 10/2013 |
| WO | 2013/150990 A1 | 10/2013 |
| WO | 2013/153195 A1 | 10/2013 |
| WO | 2014/010490 A1 | 1/2014 |
| WO | 2014/012125 A1 | 1/2014 |
| WO | 2014/028022 A1 | 2/2014 |
| WO | 2014038326 A1 | 3/2014 |
| WO | 2014/064492 A1 | 5/2014 |
| WO | 2014/079478 A1 | 5/2014 |
| WO | 2014/079570 A1 | 5/2014 |
| WO | 2014/085660 A1 | 6/2014 |
| WO | 2014085663 A1 | 6/2014 |
| WO | 2014/111385 A1 | 7/2014 |
| WO | 2014/111794 A1 | 7/2014 |
| WO | 2014/121261 A1 | 8/2014 |
| WO | 2014148020 A1 | 9/2014 |
| WO | 2014/161535 A2 | 10/2014 |
| WO | 2014/161534 A3 | 11/2014 |
| WO | 2014205301 A2 | 12/2014 |
| WO | 2015/029286 A1 | 3/2015 |
| WO | 2015/077113 A1 | 5/2015 |
| WO | 2015/094898 A2 | 6/2015 |
| WO | 2015/095088 A1 | 6/2015 |
| WO | 2015/095090 A1 | 6/2015 |
| WO | 2015/095146 A1 | 6/2015 |
| WO | 2015/095151 A2 | 6/2015 |
| WO | 2015/100056 A1 | 7/2015 |
| WO | 2015113023 A1 | 7/2015 |
| WO | 2015/127583 A1 | 9/2015 |
| WO | 2015157202 A1 | 10/2015 |
| WO | 2016/005455 A1 | 1/2016 |
| WO | 2016/010991 A1 | 1/2016 |
| WO | 2016010954 A2 | 1/2016 |
| WO | 2016/069821 A1 | 5/2016 |
| WO | 2016089844 A1 | 6/2016 |
| WO | 2016118683 A1 | 7/2016 |
| WO | 2016/154284 A1 | 9/2016 |
| WO | 2016/178966 A1 | 11/2016 |
| WO | 2016176171 A1 | 11/2016 |
| WO | 2016/201027 A2 | 12/2016 |
| WO | 2017038075 A1 | 3/2017 |
| WO | 2017062798 A1 | 4/2017 |
| WO | 2017/127489 A1 | 7/2017 |
| WO | 2017/210376 A1 | 12/2017 |
| WO | 2018162385 A1 | 9/2018 |

OTHER PUBLICATIONS

Borghi et al; "M2 Factor of Bessel-Gauss Beams"; Optics Letters; vol. 22, No. 5; (1997) pp. 262-264.

Chen et al. "Development of an AOI system for chips with a hole on backside based on a frame imager" Proc. of SPIE vol. 9903, 2016. 6 pgs.

Iijima et al; "Resistivity Reduction by External Oxidation of Cu—Mn Alloy Films for Semiconductor Interconnect Application"; Journal of Vacuum Science & Technology B: Microelectronics and Nanometer Structures Processing, Measurement, and Phenomena, 27, 1963-1968 (2009.

Intergrace, "Borosilicate glass: technical glass by Pulles & Hanique: Duan & Pyrex," Pulles & Hanique B.V., 2 pgs. Published Mar. 15, 2012, retrieved from: https://web.archive.org/web/20120315092729/http://www.pulleshanique.com/02_borosilicate-glass.htm.

Kiyama et al; "Examination of Etching Agent and Etching Mechanism on Femtosecond Laser Microfabrication of Channels Inside Vitreous Silica Substrates"; J. Phys. Chem. C, 2009, 113, pp. 11560-11566.

Koike et al; "P-33: Cu—Mn Electrodes for a-Si TFT and Its Electrical Characteristics"; SID Symposium Digest of Technical Papers, 41:1, 1343-1346 (2010.

Koike et al; "Self-Forming Diffusion Barrier Layer in Cu—Mn Alloy Metallization"; Appl. Phys. Lett. 87, 041911-1-041911-3 (2005.

Microchemicals, "Silicon Wafers, Quartz Wafers, Glass Wafers," Product Specifications: Brochure. 2014, 28 pgs.

Ogutu et al; "Superconformal Filling of High Aspect Ratio Through Glass Vias (TGV) for Interposer Applications Using TNBT and NTBC Additives"; Journal of the Electrochemical Society, 162 (9), D457-D464 (2015.

P-23:The Contact Properties and TFT Structures of A-IGZO TFTs Combined With Cu—Mn Alloy Electrodes"; SID Symposium Digest of Technical Papers 42:1, 1177-1180".

(56) References Cited

OTHER PUBLICATIONS

Shorey et al; "Progress and Application of Through Glass via (TGV) Technology"; 2016 Pan Pacific Microelectronis Symposium, SMTA, Jan. 25, 2016; pp. 1-6.
Shorey; "Leveraging Glass for Advanced Packaging and IoT"; Apr. 21, 2016, Retrieved Form the Internet: URL:http://www.corning.com/media/worldwide/cdt/documents/iMAPs%20-%20Corning%20Overview%20-%204-21-16%20FINALpptx.pdf.
Siegman; "New Development in Laser Resonators"; SPIE, vol. 1227, Optical Resonators (1990) pp. 2-14.
Thiele; "Relation Between Catalytic Activity and Size of Particle"; Industrial and Engineering Chemistry, vol. 31, No. 7; (1939) pp. 916-920.
Topper et al; "3-D Thin Film Interposer Based on TGV (Through Glass Vias): An Alternative to Si-Interposer"; IEEE, Electronic Components and Technology Conference; 2010; pp. 66-73.
U.S. Appl. No. 62/846,059; Cai et al. "Silicate Glass Compositions Useful for the Efficient Production of Through Glass Vias", filed May 10, 2019, 43 pgs. Listed in ID as 28483.
U.S. Appl. No. 62/846,102; Guo et al. "High Silicate Glass Articles Possessing Through Glass Vias and Methods of Making and Using Thereof", filed May 10, 2019, 36 pgs. Listed in ID as 28303.
Wakayama et al. "Small size probe for inner profile measurement of pipes using optical fiber ring beam device" Proc. of SPIE vol. 8563, 2012. 7 pgs.
Wu et al, "A Study on Annealing Mechanisms With Different Manganese Contents in CuMn Alloy"; Journal of Alloys and Compounds, vol. 542, 2012, pp. 118-123.
Zavyalov, "3D Hole Inspection Using Lens with High Field Curvature" Measurement Science Review, V. 15, No. 1, 2015. pp 52-57.
Interational Search Report and Written Opinion PCT/US2018/065344 Dated Apr. 26, 2019, 11 Pgs.
Chen et al. "Projection ablation of glass-based single and arrayed microstructures using excimer laser", (2005) Optics and Laser Technology 37, 271-280.
Corning, "Properties of VYCOR Code 7913 96% Silica High Temperature Glass," Apr. 2014.
Koyama et al. "Laser-micromachining for Ag Ion Exchanged Glasses," Second International Symposium on Laser Precision Microfabrication, Proc. SPE vol. 4426 (2002) 162-165.
Kruger et al. "UV laser drilling of SiC for semiconductor device fabrication," J. Physics:Conference Series 59 (2007) 740-744.
Li et al. "Thick Polymer cover layers for laser micromachining of fine holes," Applied Physics A, Sep. 2005, vol. 81, Issues 4, pp. 753-758.
Madehow.com, Liquid Crystal Display (LCD), Jan. 29, 2006, https://fweb.archive.org/web/20060129092154/http://www.madehow.com/Volume-1/Liquid-Crystal-Display-LCD.html; pp. 1-6.
Matsusaka et al. "Micro-machinability of silversodium ion-exchanged glass by UV nanosecond laser," J. Materials Processing Technology 202 (2008) 514-520.
Mukhina L.; "Laser Pulse Damage on the Surface of Ion Exchange Treated Glass"; Soviet Journal of Glass Physics and Chemistry; vol. 19; No. 3; pp. 269-272; (1993.
Ramil et al. "Micromachining of glass by the third harmonic of nanosecond Nd:YVO4 laser", Applied Surface Science 255 (2009) p. 5557-5560.
Swift Glass, "Quartz/Fused Silica," Mar. 2016.
Tsai et al. "Investigation of underwater laser drilling for brittle substrates," J. Materials Processing technology 209 (2009) 2838-2846.
Uzgiris et al. "Etched Laser Filament Tracks in Glasses and Polymers", (1973) Phys. Rev. A 7, 734-740.
Wlodarczyk et al. "The Impact of Graphite Coating and Wavelength on Picosecond Laser Machining of Optical Glasses,", 31st ICALEO Program Notes (2012). Paper M#309.
ASTM standard C770-16, entitled "Standard Test Method for Measurement of Glass Stress-Optical Coefficient,".
Handbook of Adhesives (3rd edition, Edited by Irving Skeist).

Miranda et al. (Ultraviolet-induced crosslinking of poly(vinyl alcohol) evaluated by principal component analysis of FTIR spectra; Polym Int 50:1068-1072(2001 ).
Polavka et al. "Crosslinking of polymers by the effect of ultraviolet radiation crosslinking of poly(vinyl alcohol) in the presence ofterephthalic aldehyde"; 1980.
Tom Christiansen, Tami Erickson; Standard Operating Procedure: Spin-On-Glass, Surface Level Characterization (2000).
Mbise et al. "Angular selective window coatings: theory and experiments" J. Phys. D: Appl. Phys. 30 2103 (1997).
McGloin et al."Bessel beams: diffraction in a new light" Contemporary Physics, vol. 46 No. 1 (2005) pp. 15-28.
Merola et al. "Characterization of Bessel beams generated by polymeric microaxicons" Meas. Sci. Technol. 23 (2012) 10 pgs.
MicroChemicals, Silicon Wafers Quartz Wafers Glass Wafers, 2014 (no month) (Year: 2014).
Mirkhalaf, M. et al., Overcoming the brittleness of glass through bio-inspiration and micro-achitecture, Nature Communications, 5:3166/ncomm4166(2014).
Perry et al., "Ultrashort-pulse laser machining of dielectric materials"; Journal of Applied Physics, vol. 85, No. 9, May 1, 1999, American Institute of Physics, pp. 6803-6810.
Perry et al., "Ultrashort-pulse laser machining"; UCRL-1D-132159, Sep. 1998, pp. 1-38.
Perry et al., "Ultrashort-pulse laser machining"; UCRL-JC-132159 Rev 1., Jan. 22, 1999, pp. 1-24.
Polynkin et al., "Extended filamentation with temporally chirped femtosecond Bessel-Gauss beams in air"; Optics Express, vol. 17, No. 2, Jan. 19, 2009, OSA, pp. 575-584.
Romero et al. "Theory of optimal beam splitting by phase gratings. II. Square and hexagonal gratings" J. Opt. Soc. Am. A/vol. 24 No. 8 (2007) pp. 2296-2312.
Salleo A et al., Machining of transparent materials using IR and UV nanosecond laser pulses, Appl. Physics A 71, 601-608, 2000.
Serafetinides et al., "Polymer ablation by ultra-short pulsed lasers" Proceedings of SPIE vol. 3885 (2000) http://proceedings. spiedigitallibrary.org/.
Serafetinides et al., "Ultra-short pulsed laser ablation of polymers"; Applied Surface Science 180 (2001) 42-56.
Shah et al. "Micromachining with a high repetition rate femtosecond fiber laser", Journal of Laser Micro/Nanoengineering vol. 3 No. 3 (2008) pp. 157-162.
Shealy et al. "Geometric optics-based design of laser beam shapers",Opt. Eng. 42(11), 3123-3138 (2003). doi:10.1117/1.1617311.
Smedskjaer et al; "Impact of ZnO on the Structure and Properties of Sodium Aluminosilicate Glasses: Comparison With Alkaline Earth Oxides," Journal of Non-Crystalline Solids 381, 58-64 (2013).
Stoian et al. "Spatial and temporal laser pulse design for material processing on ultrafast scales" Applied Physics A (2014) 114, p. 119-127.
Sundaram et al., "Inducing and probing non-thermal transitions in semiconductors using femtosecond laser pulses"; Nature Miracles, vol. 1, Dec. 2002, Nature Publishing Group (2002), pp. 217-224.
Taiwanese Patent Application No. 106121686, Office Action dated Jan. 19, 2021, 5 Pages (English Translation Only); Taiwanese Patent Office.
Toytman et al. "Optical breakdown in transparent media with adjustable axial length and location", Optics Express vol. 18 No. 24, 24688-24698 (2010).
Vanagas et al., "Glass cutting by femtosecond pulsed irradiation"; J. Micro/Nanolith. MEMS Moems. 3(2), 358-363 (Apr. 1, 2004); doi: 10.1117/1.1668274.
Varel et al., "Micromachining of quartz with ultrashort laser pulses"; Applied Physics A 65, 367-373, Springer-Verlag (1997).
Velpula et al.. "Ultrafast imaging of free carriers: controlled excitation with chirped ultrafast laser Bessel beams", Proc. of SPIE vol. 8967 896711-1 (2014).
Wang et al, "Investigation on CO2 laser irradiation inducing glass strip peeling for microchannel formation", Biomicrofluidics 6, 012820 (2012).

(56) References Cited

OTHER PUBLICATIONS

Wu et al. "Optimal orientation of the cutting head for enhancing smoothness movement in three-dimensional laser cutting" (2013) Zhongguo Jiguang/Chinese Journal of Lasers, 40 (1), art. No. 0103005.
Xu et al. "Optimization of 3D laser cutting head orientation based on the minimum energy consumption" (2014) International Journal of Advanced Manufacturing Technology, 74 (9-12), pp. 1283-1291.
Yan et al. "Fiber structure to convert a Gaussian beam to higher-order optical orbital angular momentum modes" Optics Letters vol. 37 No. 16 (2012) pp. 3294-3296.
Zeng et al. "Characteristic analysis of a refractive axicon system for optical trepanning"; Optical Engineering 45(9), 094302 (Sep. 2006), pp. 094302-1-094302-10.
Zhang et al., "Design of diffractive-phase axicon illuminated by a Gaussian-profile beam"; Acta Physica Sinica (overseas edition), vol. 5, No. 5 (May 1996) Chin. Phys. Soc., 1004-423X/96/05050354-11, pp. 354-364.
"EagleEtch" Product Brochure, EuropeTec USA Inc., pp. 1-8, Aug. 1, 2014.
"PHAROS High-power femtosecond laser system" product brochure; Light Conversion, Vilnius, LT; Apr. 18, 2011, pp. 1-2.
"TruMicro 5000" Product Manual, Trumpf Laser GmbH + Co. KG, pp. 1-4, Aug. 2011.
"What is the difference between Ra and RMS?"; Harrison Electropolishing LP; (http://www.harrisonep.com/electropolishingra.html), Accessed Aug. 8, 2016.
Abakians et al."Evaporative Cutting of a Semitransparent Body With a Moving CW Laser", J. Heat Transfer 110(4a), 924-930 (Nov. 1, 1988) (7 pages) doi:10.1115/1.3250594.
Abramov et al., "Laser separation of chemically strengthened glass"; Physics Procedia 5 (2010) 285-290, Elsevier.; doi: 10.1016/j.phpro.2010.08.054.
Ahmed et al. "Display glass cutting by femtosecond laser induced single shot periodic void array" Applied Physics A: Materials Science and Proccessing vol. 93 No. 1 (2008) pp. 189-192.
Arimoto et al., "Imaging properties of axicon in a scanning optical system"; Applied Optics, Nov. 1, 1992, vol. 31, No. 31, pp. 6653-6657.
Bagchi et al. "Fast ion beams from intense, femtosecond laser irradiated nanostructured surfaces" Applied Physics B 88 (2007) p. 167-173.
Bhuyan et al. "Laser micro- and nanostructuring using femtosecond Bessel beams", Eur. Phys. J. Special Topics 199 (2011) p. 101-110.
Bhuyan et al. "Single shot high aspect ratio bulk nanostructuring of fused silica using chirp-controlled ultrafast laser Bessel beams" Applied Physics Letters 104 (2014) 021107.
Bhuyan et al., "Femtosecond non-diffracting Bessel beams and controlled nanoscale ablation" by IEEE (2011).
Bhuyan et al., "High aspect ratio nanochannel machining using single shot femtosecond Bessel beams"; Applied Physics Letters 97, 081102 (2010); doi: 10.1063/1.3479419.
Bhuyan et al., "High aspect ratio taper-free microchannel fabrication using femtosecond Bessel beams"; Optics Express (2010) vol. 18, No. 2, pp. 566-574.
Case Design Guidelines for Apple Devices Release R5 (https://web.archive.org/web/20131006050442/https://developer.apple.com/resources/cases/Case-Design-Guidelines.pdf; archived on Oct. 6, 2013).
Chiao et al. 9. "Self-trapping of optical beams," Phys. Rev. Lett, vol. 13, No. 15, p. 479 (1964).
Corning Inc., "Corning(Registered) 1737 AM LCD Glass Substrates Material Information", issued Aug. 2002.
Corning Inc., "Corning(Registered) Eagle2000 TM AMLCD Glass Substrates Material Information", issued Apr. 2005.
Couairon et al. "Femtosecond filamentation in transparent media" Physics Reports 441 (2007) pp. 47-189.
Courvoisier et al. "Applications of femtosecond Bessel beams to laser ablation" Applied Physics A (2013) 112, p. 29-34.
Courvoisier et al. "Surface nanoprocessing with non-diffracting femtosecond Bessel beams" Optics Letters vol. 34 No. 20, (2009) p. 3163-3165.
Cubeddu et al., "A compact time-resolved reflectance system for dual-wavelength multichannel assessment of tissue absorption and scattering"; Part of the SPIE Conference on Optical Tomography and Spectroscopy of Tissue III, San Jose, CA (Jan. 1999), SPIE vol. 3597, 0277-786X/99, pp. 450-455.
Cubeddu et al., "Compact tissue oximeter based on dual-wavelength multichannel time-resolved reflectance"; Applied Optics, vol. 38, No. 16, Jun. 1, 1999, pp. 3670-3680.
Ding et al., "High-resolution optical coherence tomography over a large depth range with an axicon lens"; Optic Letters, vol. 27, No. 4, pp. 243-245, Feb. 15, 2002, Optical Society of America.
Dong et al. "On-axis irradiance distribution of axicons illuminated by spherical wave", Optics & Laser Technology 39 (2007) 1258-1261.
Duocastella et al. "Bessel and annular beams for material processing", Laser Photonics Rev. 6, 607-621, 2012.
Eaton et al. "Heat accumulation effects in femtosecond laser written waveguides with variable repetition rates", Opt. Exp. 5280, vol. 14, No. 23, Jun. 2006.
Gattass et al. "Micromachining of bulk glass with bursts of femtosecond laser pulses at variable repetition rates" Opt. Exp. 5280, vol. 14, No. 23, Jun. 2006.
Girkin et al., "Macroscopic multiphoton biomedical imaging using semiconductor saturable Bragg reflector modelocked Lasers"; Part of the SPIE Conference on Commercial and Biomedical Applications of Ultrafast Lasers, San Jose, CA (Jan. 1999), SPIE vol. 3616, 0277-786X/99, pp. 92-98.
Glezer et al., "Ultrafast-laser driven micro-explosions in transparent materials"; Applied Physics Letters, vol. 71 (1997), pp. 882-884.
Golub, I., "Fresnel axicon"; Optic Letters, vol. 31, No. 12, Jun. 15, 2006, Optical Society of America, pp. 1890-1892.
Gori et al. "Analytical derivation of the optimum triplicator" Optics Communications 157 (1998) pp. 13-16.
Herman et al., "Laser micromachining of 'transparent' fused silica with 1-ps pulses and pulse trains"; Part of the SPIE Conference on Commercial and Biomedical Applications of Ultrafast Lasers, San Jose, CA (Jan. 1999), SPIE vol. 3616, 0277-786X/99, pp. 148-155.
Honda et al. "A Novel Polymer Film that Controls Light Transmission", Progress in Pacific Polymer Science 3, 159-169 (1994).
Hu et al. "5-axis laser cutting interference detection and correction based on STL model" (2009) Zhongguo Jiguang/Chinese Journal of Lasers, 36 (12), pp. 3313-3317.
Huang et al., "Laser etching of glass substrates by 1064 nm laser irradiation", Applied Physics, Oct. 2008, vol. 93, Issue 1, pp. 159-162.
Jaramillo et al., Wet etching of hydrogenated amorphous carbon films, Mar. 7, 2001, Diamond and Related Materials, vol. 10, Issues 3-7, pp. 976-979 (Year: 2001).
Juodkazis S. et al. Laser induced microexplosion confined in the bulk of a sapphire crystal: evidence of multimegabar pressures., Phys. Rev. Lett. 96, 166101, 2006.
Karlsson et al. "The technology of chemical glass strengthening—a review" Glass Technol: Eur. J. Glass Sci. Technol. A (2010) 51 (2) pp. 41-54.
Kondo et al., Three-Dimensional Microdrilling of Glass by Multiphoton Process and Chemical Etching, 1999, Japanese Journal of Applied Physics, vol. 38, Part 2, No. 10A (Year: 1999).
Kosareva et al., "Formation of extended plasma channels in a condensed medium upon axicon focusing of a femtosecond laser pulse"; Quantum Electronics 35 (11) 1013-1014 (2005), Kvantovaya Elektronika and Turpion Ltd.; doi: 10.1070/QE2005v035n11ABEH013031.
Kruger et al., "Femtosecond-pulse visible laser processing of transparent materials"; Applied Surface Science 96-98 (1996) 430-438.
Kruger et al., "Laser micromachining of barium aluminium borosilicate glass with pluse durations between 20 fs and 3 ps"; Applied Surface Science 127-129 (1998) 892-898.
Lapczyna et al., "Ultra high repetition rate (133 MHz) laser ablation of aluminum with 1.2-ps pulses"; Applied Physics A 69 [Suppl.], S883-S886, Springer-Verlag (1999); doi: 10.1007/s003399900300.

(56) References Cited

OTHER PUBLICATIONS

Levy et al. "Design, fabrication, and characterization of circular Dammann gratings based on grayscale lithography," Opt. Lett vol. 35, No. 6, p. 880-882 (2010).
Liu X et al. "laser ablation and micromachining with ultrashort laser pulses", IEEE J. Quantum Electronics, 22, 1706-1716, 1997.
Maeda et al. "Optical performance of angle-dependent light-control glass", Proc. SPIE 1536, Optical Materials Technology for Energy Efficiency and Solar Energy Conversion X, 138 (Dec. 1, 1991).
Pie Scientific, Photoresist stripping and descum organic contamination removal for silicon wafer, Feb. 2016 (Year: 2016).
West et al., Optimisation of photoresist removal from silicon wafers using atmosphericpressure plasma jet effluent, Jul. 2015, 22nd International Symposium on Plasma Chemistry (Year: 2015).
Taiwanese Patent Application No. 107117314, Office Action, dated Aug. 16, 2022, 1 page; Taiwanese Patent Office.

\* cited by examiner

METHODS FOR ETCHING VIAS IN GLASS-BASED ARTICLES EMPLOYING POSITIVE CHARGE ORGANIC MOLECULES

This application claims the benefit of priority to U.S. Provisional Application Ser. No. 62/607,638 filed on Dec. 19, 2017, the content of which is relied upon and incorporated herein by reference in its entirety.

BACKGROUND

Field

The present specification generally relates to methods for forming vias within glass-based articles and, more particularly, methods for forming vias within glass-based articles having an increased waist diameter by employing positive charge organic molecules within an etching solution.

Technical Background

Glass-based articles having vias may be used in a wide variety of applications. Glass material may be particularly desirable for electronics applications due to its electrical properties, such as low dielectric constant and low dissipation factor. Such electrical properties may be desirable in high-frequency applications, such as wireless communications applications. Glass-based articles having vias may be utilized as a redistribution layer or an interposer, for example.

Vias may be formed within a glass-based article by a laser-damage-and-etch process wherein damage tracks are formed through the bulk of the glass-based article by a pulsed laser beam. The glass-based article having the damage tracks is then etched using an etching solution. An etch rate of the material within the damage track is higher than a bulk etch rate of the material that was not damaged by the laser beam. Therefore, vias may be formed through the glass-based article.

However, laser-damage-and-etch processes may produce vias having a waist diameter that is significantly smaller than the opening diameters at the first and second surfaces of the glass-based article. This leads to vias having an hourglass shape. Vias with a narrow waist may present challenges in downstream processes, such as metallization of the vias with an electrically conductive material.

SUMMARY

In some embodiments, a method of forming a via in a glass-based article includes forming a damage track through a bulk of the glass-based article extending from a first surface of the glass-based article to a second surface of the glass-based article, and applying an etching solution to the glass-based article to form the via. The etching solution includes at least one acid and a positive charge organic molecule. An etch rate at the first surface and the second surface is lower than an etch rate at the damage track.

In some embodiments, a method of forming a via in a glass-based article includes applying an etching solution to a glass-based article to form the via. Prior to etching, the glass-based article has a damage track formed through a bulk of the glass-based article extending from a first surface of the glass-based article to a second surface of the glass-based article. The etching solution comprises at least one acid and a positive charge organic molecule. An etch rate at the first surface and the second surface is lower than an etch rate at the damage track.

In some embodiments, a method of forming a via in a glass-based article includes applying a pulsed laser beam having a line focus through a bulk of the glass-based article to form a damage track through the bulk of the glass-based article extending from a first surface of the glass-based article to a second surface of the glass-based article. The method further includes applying an etching solution to the glass-based article to form the via. The etching solution includes hydrofluoric acid and PDADMAC, and an etch rate at the first surface and the second surface is lower than an etch rate at the damage track.

In some embodiments, a method of forming a via in a glass-based article, the method includes applying a pulsed laser beam having a line focus through a bulk of the glass-based article to form a damage track through the bulk of the glass-based article extending from a first surface of the glass-based article to a second surface of the glass-based article. The method further includes applying an etching solution to the glass-based article to form the via. The etching solution includes hydrofluoric acid and PDADMAC, and an etch rate at the first surface and the second surface is lower than an etch rate at the damage track.

BRIEF DESCRIPTION OF THE DRAWINGS

The foregoing will be apparent from the following more particular description of the example embodiments, as illustrated in the accompanying drawings in which like reference characters refer to the same parts throughout the different views. The drawings are not necessarily to scale, emphasis instead being placed upon illustrating the representative embodiments.

DETAILED DESCRIPTION

The embodiments disclosed herein relate to methods for etching vias in glass-based articles using an etching solution including positive charge organic molecules (e.g., surfactants and polyelectrolytes) that retard the bulk etch rate of the surface of the glass-based article and do not retard, or retard to a lesser extent, a via etch rate. Thus, vias etched in glass-based articles according to the methods described herein have a larger waist diameter, and therefore less of an hourglass shape, than vias etched by an etching solution not including positive charge organic molecules. Embodiments described herein improve via shape without changing glass composition or glass properties.

The larger waist diameter of the vias may lead to improvement in downstream processes, such as metallization of the vias. Non-limiting example metallization methods include bottom-up plating and paste filling. The glass-based articles described herein may include metalized vias and may be provided as components in electronic devices, such as a redistribution layer (e.g., in a wireless communications device) or as an interposer.

Various embodiments of methods for forming vias in glass-based articles are described in detail below.

Figure 1:
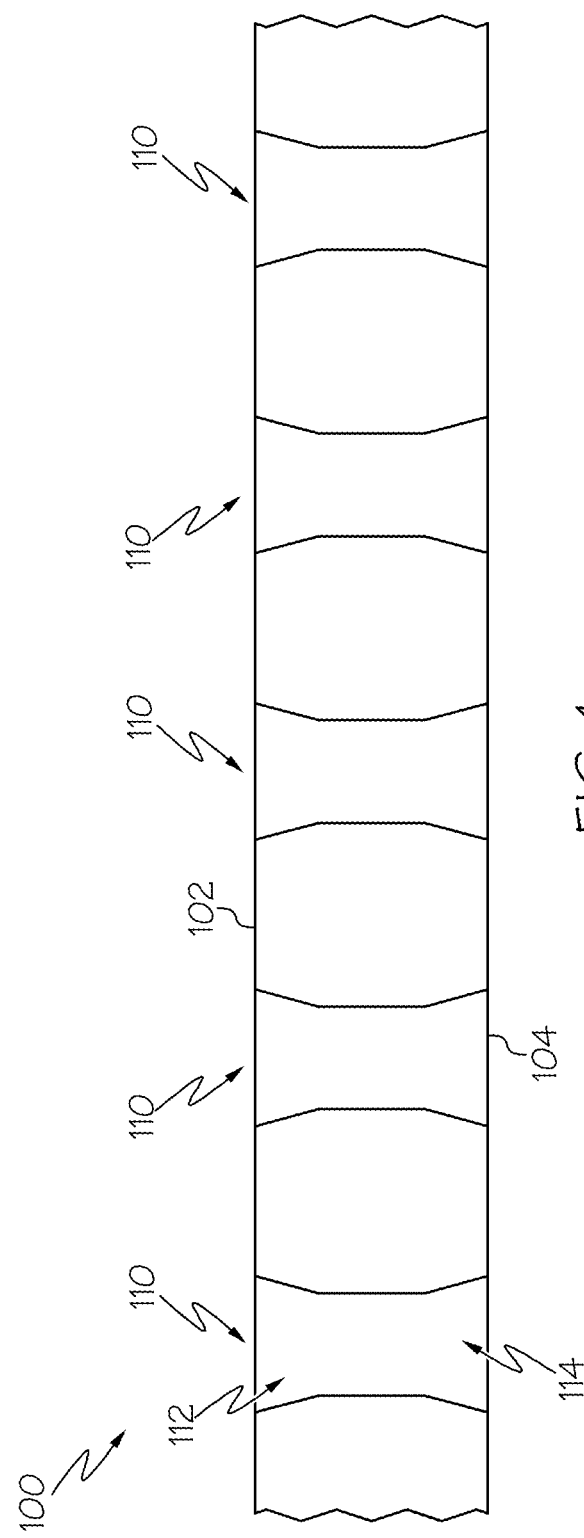
FIG. 1 schematically depicts a partial side view of a glass-based article having vias according to one or more embodiments described and illustrated herein.

Referring now to FIG. 1, a glass-based article 100 having a plurality of vias 110 ("vias") disposed therethrough is schematically illustrated. The glass-based article 100 may be used as a product in an electronic device, for example. Non-limiting products include a redistribution layer and an interposer. It should be understood that the glass-based article 100 may be utilized as other products performing other functions.

The glass-based article 100 has a first surface 102 and a second surface 104. The vias 110 extend through a bulk of the glass-based article 100 from the first surface 102 to the second surface 104. Although the vias 110 depicted in FIG. 1 are through-hole vias, embodiments are not limited thereto. Vias of the present disclosure may be blind vias that do not extend fully through the glass-based article. The thickness of the glass-based articles described herein is not limited by this disclosure. As an example and not a limitation, the glass-based articles 100 described herein may have a thickness after etching within a range of 200 µm to 700 µm, or within a range of 200 µm, to 500 µm, including endpoints. It should be understood that the glass-based articles 100 may have other thicknesses depending on the end application.

The glass-based article 100 may be fabricated from any glass-based material capable of being etched by a chemical etching process. Non-limiting example glass-based materials include aluminosilicate glass, borosilicate glass, fused silica, soda lime glass, and glass-ceramic materials. The glass-based materials described herein have transparency for at least one laser operating wavelength that is sufficient to allow the creation of damage tracks. Non-limiting examples of suitable laser operating wavelengths include 532 nm and 1064 nm. Any suitable glass-based material may be used.

Each via 110 has a first opening 112 at the first surface, a second opening 114 at the second surface, and a waist W. The waist W of the vias 110 is located between the first opening 112 and the second opening 114. As described in more detail below, the diameter of the waist W of the via 110 may be less than a diameter of the first opening 112 and/or the second opening 114. In some embodiments, the diameter of the waist W is substantially equal to the diameter of the first opening 112 and/or the second opening 114.

Depending on the application of the glass-based article 100, the vias 110 may be filled with an electrically conductive material by way of a metallization process. The type of metallization process used to fill the vias 110 is not limited by this disclosure. Generally, it may be desirable in metallization processes to have a waist W with a diameter close to the diameter of the first opening 112 and/or the second opening 114. Vias with a high waist diameter $D_W$ to first diameter $D_1$ (or second diameter $D_2$) may result in more reliable metallization of the vias 110. Thus, it may be desirable to increase the diameter of the waist W of the vias.

Figure 2A:
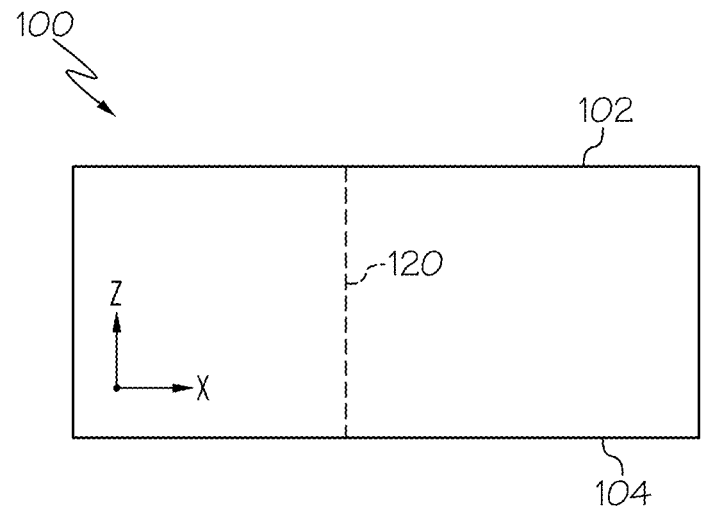
FIG. 2A schematically depicts a partial side view of a glass-based article having a damage track formed therethrough according to one or more embodiments described and illustrated herein.

The vias 110 of the glass-based articles 100 described herein are formed by a laser-damage-and-etch process wherein a damage track through a bulk of the glass-based article 100 is formed by a laser beam. Referring to FIG. 2A, a glass-based article 100 having a damage track 120 formed from the first surface 102 to the second surface 104 is schematically illustrated. The damage track 120 is a damaged region within the glass-based article 100 formed by application of a laser beam. The damage track 120 has a higher etch rate than the regions of the glass-based article outside of the damage track 120. The laser methods of forming the damage track 120 are not limited by this disclosure. Methods of forming a damage track through a glass substrate in a laser-damage-and-etch process by use of a laser beam focused into a line focus are described in U.S. Pat. Publ. No 2015/0166396, which is hereby incorporated by reference in its entirety. As an example and not a limitation, a picosecond laser may be focused into a line focus that passes through the thickness of the glass-based article 100 to damage the glass material and create a damage track 120. To form a through-hole via, the damage track 120 extends from the first surface 102 to the second surface 104. To form a blind via, the damage track 120 may start at the first surface 102 or the second surface 104, but not extend fully to the opposite surface.

Figure 2B:
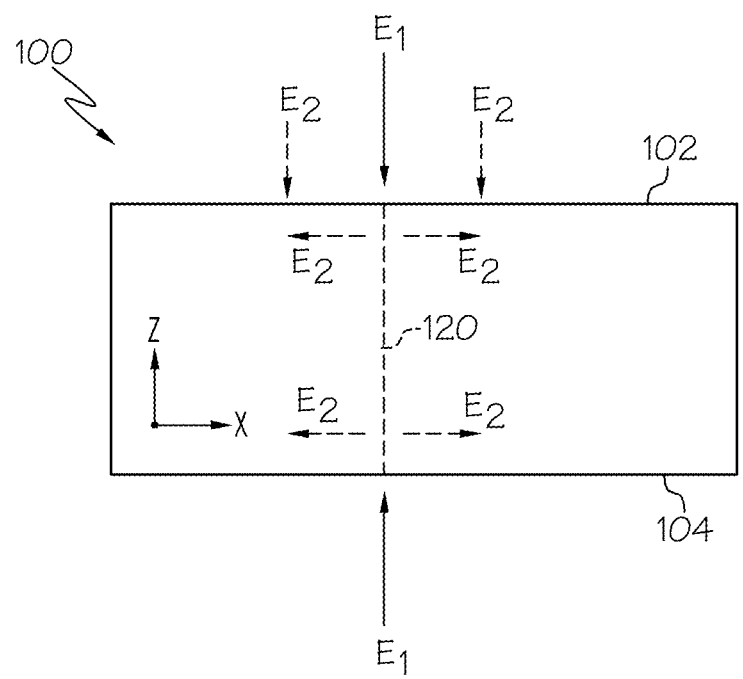
FIG. 2B schematically depicts a partial side view of the glass-based article of FIG. 2A being etched by an etching process according to one or more embodiments described and illustrated herein.

Referring now to FIG. 2B, a glass-based article 100 having one or more damage tracks therethrough is then etched in an etching solution. As non-limiting examples, the etching solution includes hydrofluoric acid in a concentration of 0.5 to 10 wt %, including endpoints, or 2.5 wt to 10 wt %, including endpoints. The etching solutions described herein may or may not include one or more mineral acids and/or strong acids. Example mineral acids and strong acids include, but are not limited to, hydrochloric acid, nitric acid, sulfuric acid, phosphoric acid, acetic acid, and tartaric acid. In embodiments, the etching solution may include 0 to 40 wt % mineral acid, including endpoints. The etching solutions described herein may also include one or more fluoride-containing compounds, such as, without limitation, ammonium fluoride, potassium fluoride, sodium fluoride, ammonium bifluoride, potassium bifluoride, and sodium bifluoride. As an example, and not a limitation, the concentration of other fluoride compounds may be 0 to 10 wt %.

The etching solution etches the first surface 102 and the second surface 104 of the glass-based article 100, as well as through the damage track 120. The glass-based article 100 may be statically etched or with applied agitation, such as ultrasonic agitation. During the etching process, the etch rate of the damaged region of the damage track 120 is defined as $E_1$ and the etch rate of the bulk region (undamaged region) is defined as $E_2$ in FIG. 2B. The ratio of $E_1/E_2$ is defined as R herein.

Figure 3A:
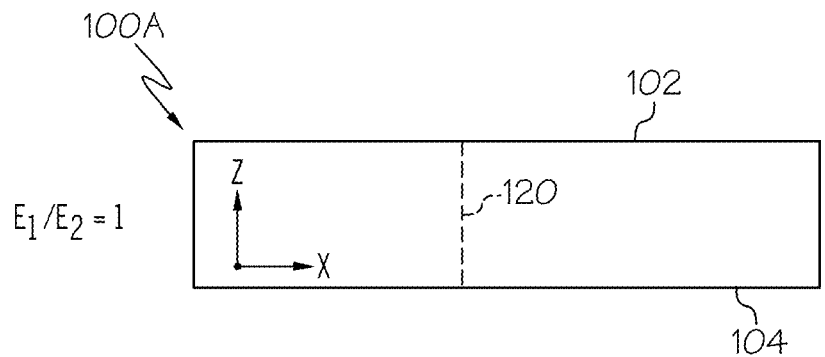
FIG. 3A schematically depicts a partial side view of the glass-based article of FIG. 2A after etching wherein $E_1/E_2=1$, where $E_1$ is a via etch rate and $E_2$ is a bulk etch rate.
Figure 3B:
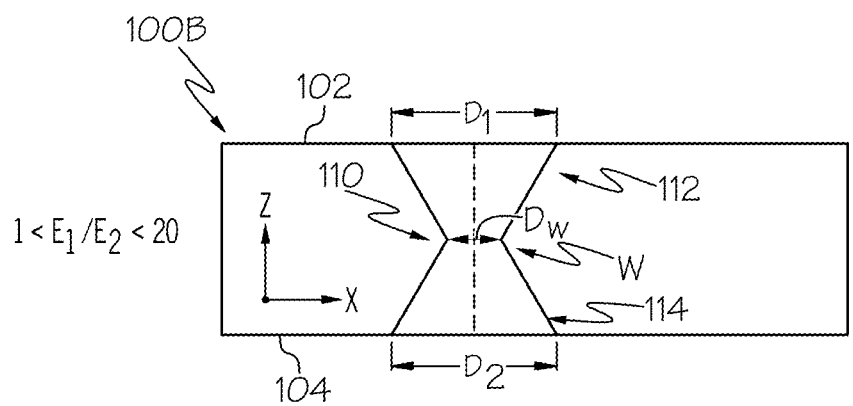
FIG. 3B schematically depicts a partial side view of the glass-based article of FIG. 2A after etching wherein $1<E_1/E_2<20$.
Figure 3C:
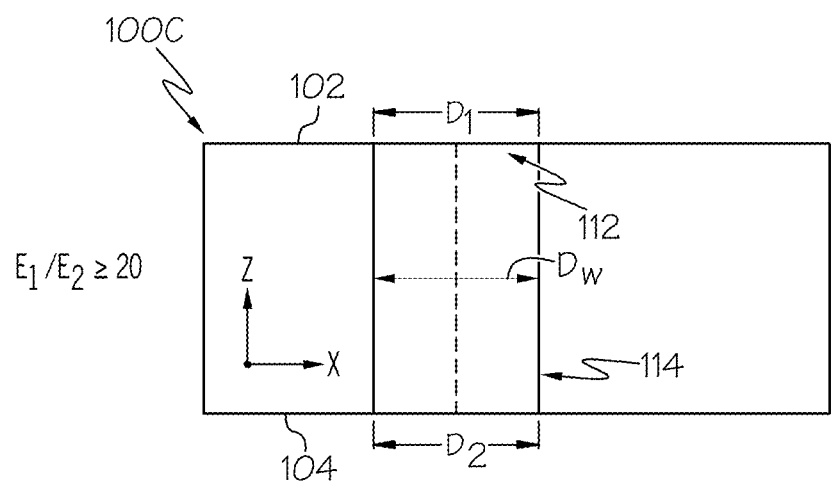
FIG. 3C schematically depicts a partial side view of the glass-based article of FIG. 2A after etching wherein $E_1/E_2 \geq 20$.

As shown in FIG. 3A, when R is equal to 1, the glass-based article 100 becomes thinner but a via is not formed because $E_1$ is equal to $E_2$. However, when R is greater than 1 but less than 20, a via 110 is formed such that the first diameter $D_1$ of the first opening 112 and the second diameter $D_2$ of the second opening 114 are significantly larger than the waist diameter $D_W$ of the waist W. When the ratio R is greater than 20, the via 110 is formed such that the waist diameter $D_W$ is close to the first diameter $D_1$ and/or the second diameter $D_2$, thereby forming a substantially cylindrical through via.

As stated above, it may be desirable to increase the ratio $D_W/D_1$ to improve the metallization process that fills the vias 110 with electrically conductive material (e.g., copper). It is noted that the first diameter $D_1$ and the second diameter $D_2$ may be used interchangeably herein because the first diameter $D_1$ and the second diameter $D_2$ may be close in value. Thus, the ratio $D_W/D_1$ also refers to the ratio $D_W/D_2$ herein.

Embodiments of the present disclosure increase the waist diameter $D_W$ without requiring a change in glass composition or a change in the laser damage process, as well as without significantly changing the initial glass thickness. Particularly, the laser-damage-and-etch processes described herein increase the waist diameter, and thus improve the ratio $D_W/D_1$ by introducing positive charge organic molecules into the etching solution.

The positive charge organic molecules self-assemble and form an etching inhibitor layer on the first surface 102 and the second surface 104 of the glass-based article 100 that slows the rate at which the acid (e.g., hydrofluoric acid) of the etching solution reaches these surfaces. This effect reduces the bulk etch rate $E_2$. When the access of the hydrofluoric acid to the glass surface is regulated (i.e., slowed down), the bulk etching rate $E_2$ may be reduced in a controllable manner. As non-limiting examples, the concentration of positive charge organic molecules may be within a range of 0.0035 wt % to 10 wt %, or 0.0035 wt % to 1 wt %, 0.0035 wt % to 0.1 wt %, or 0.0035 wt % to 0.05 wt %, including endpoints.

Figure 4:
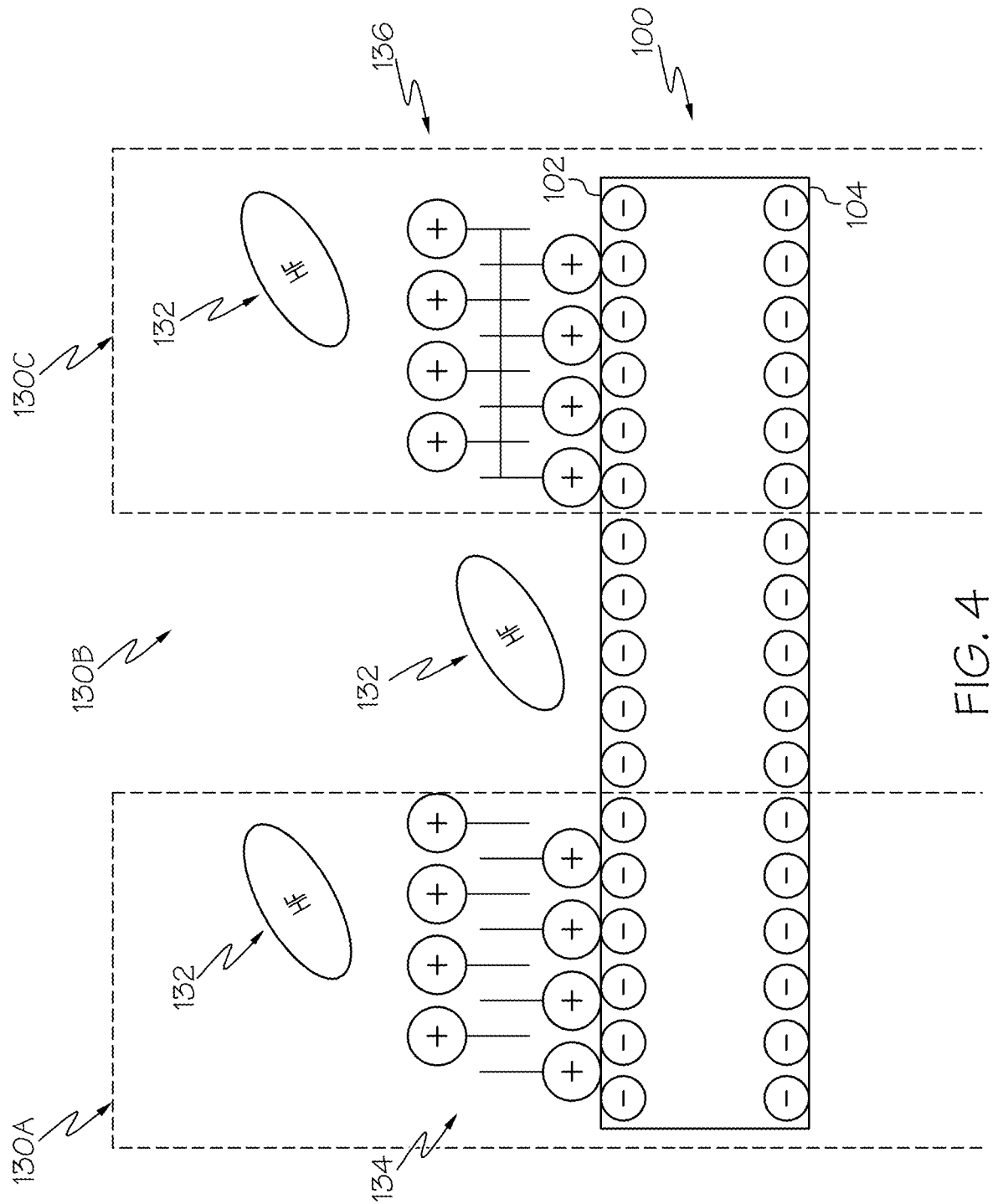
FIG. 4 schematically depicts a glass-based article having negatively charged surfaces subjected to three different etching scenarios including, positive charge surfactant, no positive charge organic molecules, and positive charge polyelectrolyte according to one or more embodiments described and illustrated herein.

As shown in FIG. 4, the first surface 102 and the second surface 104 of the glass-based article 100 is negatively charged. Particularly, the first surface 102 and the second surface 104 are negatively charged within the etching solution when the pH of the etching solution is above the isoelectric point of the material of the glass-based article 100. Thus, the etching solutions described herein have a pH value that is greater than the isoelectric point of the glass-based article 100 being etched to cause the surfaces to be negatively charged. The isoelectric point of the glass-based article 100 may depend on the composition of the glass-based article 100. The isoelectric point of the glass-based articles described herein is measured by the Zetasizer Nano ZS90 sold by Malvern Instruments Ltd of the United Kingdom. First, the glass-based article is powderized to 100 µm in average diameter particles. The particles are suspended in aqueous solutions at different pH values. The particle concentration is less than 1% by volume. Ultrasonic agitation is applied until the particles are uniformly distributed. The solution is then provided in a testing vial for zeta-potential measurement in the Zetasizer Nano ZS90. The zeta-potential of the sample is measured using the Zetasizer Nano ZS90 standard operating procedure. The zeta potential may be neutral, positive or negative. The isoelectric point is the pH value where the zeta potential is neutral.

The etching chemistry of the embodiments described herein include positive charge organic molecules to self-assemble on the negatively-charged glass surface and therefore retard glass surface etching and improve etching selectivity between laser damaged and non-damaged areas.

The "positive charge molecules" described herein may be any molecule that has a positive charge that is attracted to the negatively charged first surface 102 and second surface 104 of the glass-based article 100 and provides an etching inhibitor layer for hydrofluoric acid molecules that retards the etching effect of the hydrofluoric acid on the first surface 102 and the second surface 104. As a non-limiting example, the positive charge organic molecules may have a positive charged hydrophilic head (i.e., a hydrophilic portion) and a hydrophobic tail (i.e., a hydrophobic portion). The positive charged head is balanced with a negative charge ion, and is covalently bonded to the hydrophobic tail. Non-limiting examples of positive charge organic molecules include positive charge surfactants and positive charge polyelectrolytes. A non-limiting example of a positive charge surfactant includes cetrimonium bromide ($[C_{16}H_{33})N(CH_3)_3]Br$) hereinafter "CTAB"). A non-limiting example of a positive charge polyelectrolyte is poly(dailydimethylammonium chloride) (hereinafter "PDADMAC"). It should be understood that the etching solutions described herein may comprise a combination of one or more positive charge surfactants and one or more positive charge polyelectrolytes. Other non-limiting examples of positive charge polyelectrolytes is amine-containing polymers having a positive charge in the etching solution, such as, without limitation, polyamine, polyethylene amine, and the like.

FIG. 4 illustrates three different etching scenarios in a first region 130A, a second region 130B and a third region 130C. In all scenarios, the etching solution includes hydrogen fluoride molecules 132 that remove glass material of the glass-based article 100 when in contact with the first surface 102 and the second surface 104. It is noted that the etching solution is shown as only contacting the first surface 102 in FIGS. 4-7 and 15 for ease of illustration. It should be understood that the etching solution may contact all surfaces of the glass-based article 100. In the scenario illustrated by the second region 130B, the etching solution does not include positive charge organic molecules and thus the hydrofluoric acid molecules have access to the first surface 102 with no etching inhibitor layer. In such a case, the bulk etch rate $E_2$ is not retarded. However, in the scenario illustrated by the first region 130A, the negative charge of the first surface 102 attracts positive charge surfactant molecules 134. Therefore, the positive surfactant molecules form an etching inhibitor layer that inhibits access of the hydrogen fluoride molecules 132 to the first surface 102 (and the second surface 104) of the glass-based article 100. The hydrogen fluoride molecules 132 need to pass through the surfactant layer formed by the positive charge surfactant molecules 134. The positive charge surfactant molecules 134 reduce the ability for the hydrogen fluoride molecules 132 to contact and etch the surfaces of the glass-based article 100. Accordingly the bulk etch rate $E_2$ of the scenario illustrated by the first region 130A is slower than that of the scenario illustrated by the second region 130B.

The third region 130C illustrates positive charge polyelectrolyte molecules 136 attracted to the negatively charged first surface 102, thereby forming an etching inhibitor layer in a manner similar to the positive charge surfactant molecules 134 within the first region 130A. The positive charge polyelectrolyte molecules 136 reduce the ability for the hydrogen fluoride molecules 132 to contact and etch the first surface 102. The hydrogen fluoride molecules 132 still access the surfaces of the class-based article but at a much slower rate than when no positive charge polyelectrolyte molecules 136 are present. It is noted that, compared to the layer formed by the positive charge surfactant molecules 134, the layer formed by the positive charge polyelectrolyte molecules 136 may be more rigid and more effective in regulating the hydrogen fluoride molecules than the positive charge surfactant molecules 134. Because the positive charge polyelectrolyte molecules 136 contain more than one charge per molecule, it may be more difficult to detach from the glass surface than the positive charge surfactant molecules 134. Generally, it has been shown that the etch rate from high to low ranks as: the second region 130B>the first region 130A>the third region 130C. Thus, if the glass-based article 100 is etched using the same etching solution and at the same etch condition, adding positive charge organic molecules can modulate glass etch rate.

Figure 5:
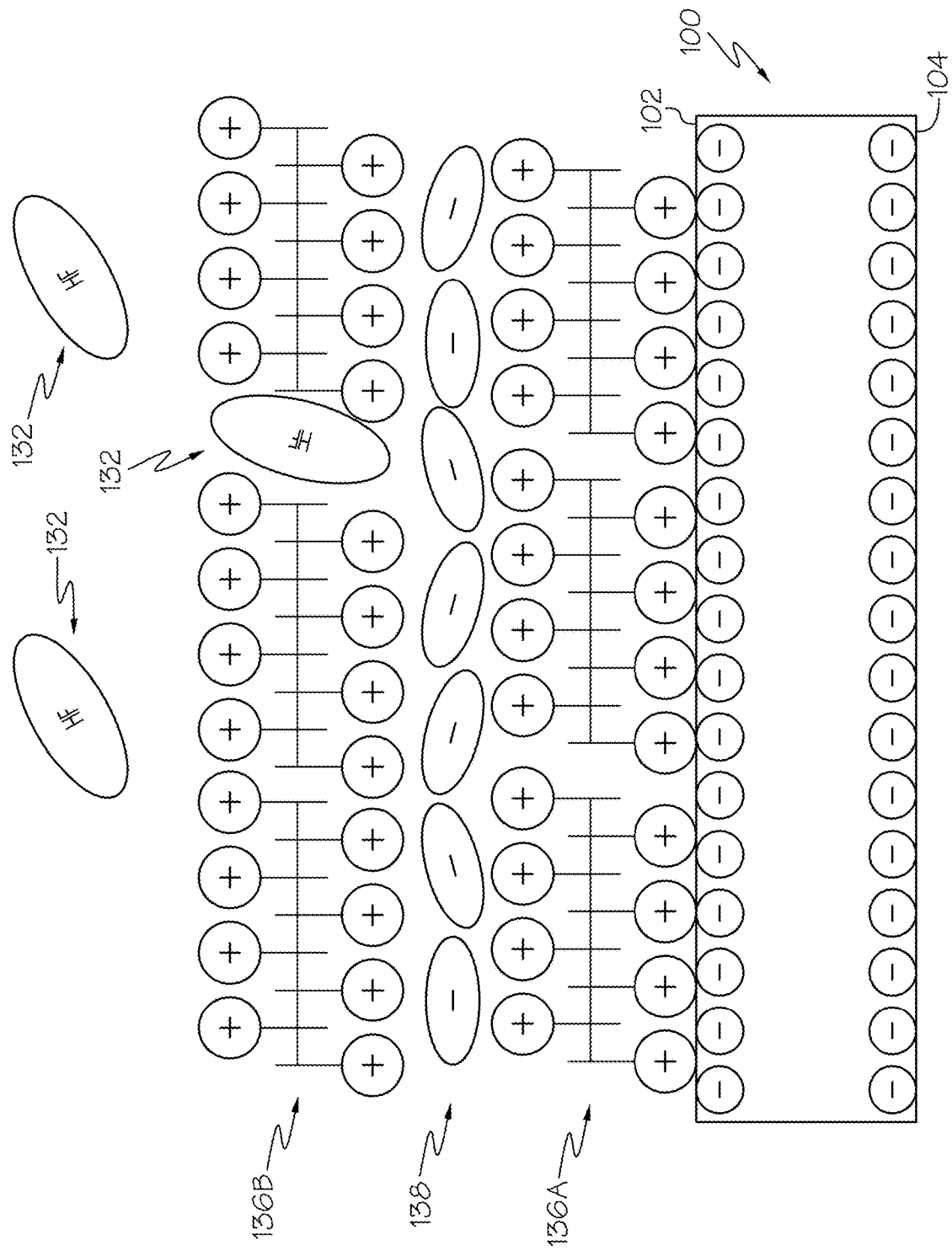
FIG. 5 schematically depicts a glass-based article and multiple layers of positive charge polyelectrolytes and a layer of glass by-products according to one or more embodiments described and illustrated herein.

FIG. 5 schematically illustrates a scenario similar to that of the third region 130C illustrated by FIG. 4 but with the addition of a graphical representation of glass by-products (e.g., $CaAlF_5$, $CaSiF_6$, $MgSiF_6$, $MgAlF_5$ depending on the composition) 138 etched by the hydrofluoric acid. In some cases, the glass by-products 138 may form an additional layer that inhibits the hydrogen fluoride molecules 132 from reaching the surfaces of the glass-based article 100. Thus, several layers formed by positive charge organic molecules and glass by-products may be formed. FIG. 5 schematically illustrates two layers of positive charge polyelectrolyte molecules 136A, 136B and one layer of glass by-products 138. It should be understood that FIG. 5 is merely a simplified illustration of the various layers that may be formed during the etching process, and that embodiments are not limited thereto.

Figure 6:
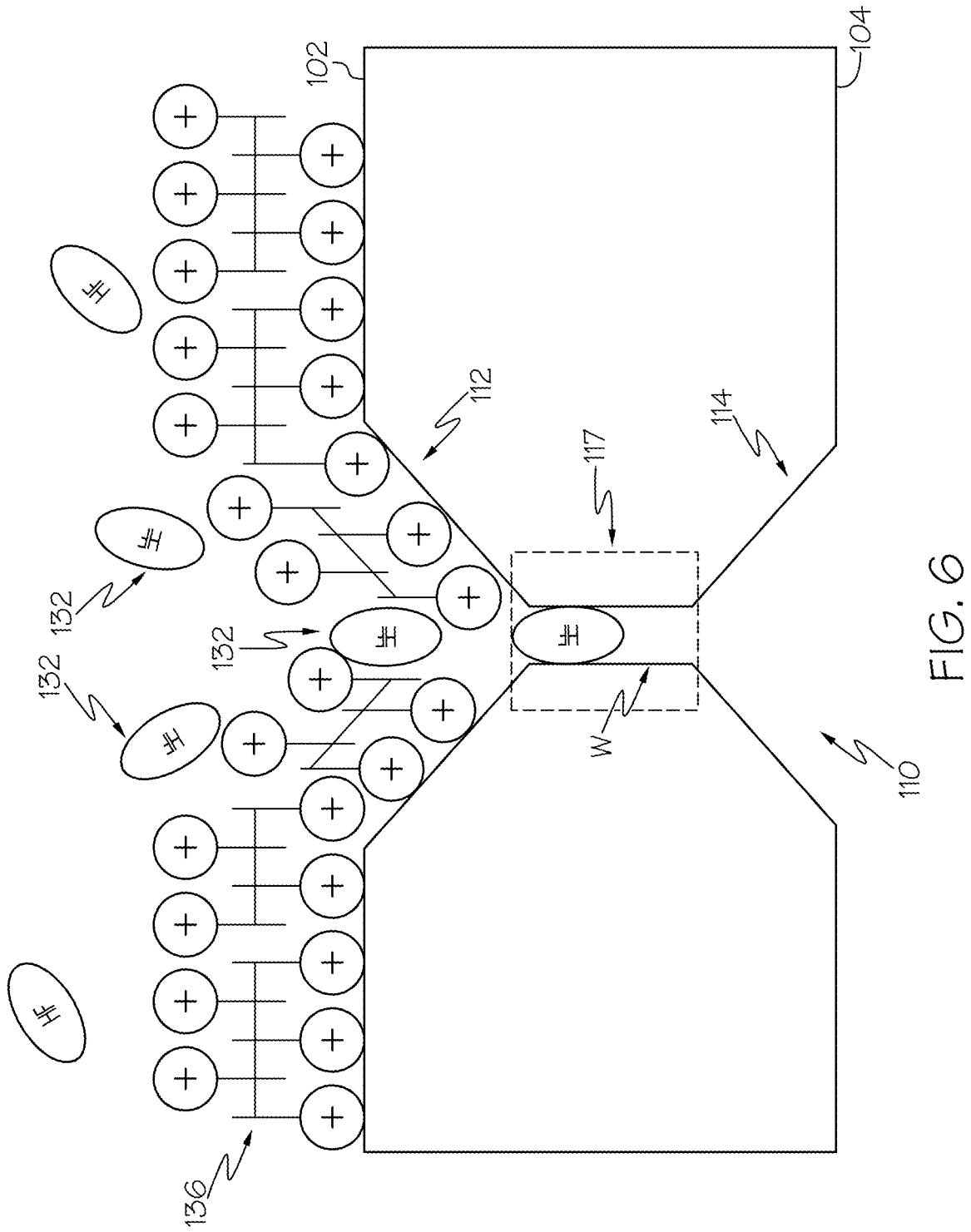
FIG. 6 schematically depicts a via being etched in a glass-based article by an etching solution including hydrogen fluoride and positive charge polyelectrolyte according to one or more embodiments described and illustrated herein.

Modulation of the bulk etch rate $E_2$ using positive charge organic molecules may be used to increase the waist diameter $D_W$ of vias 110 formed in glass-based articles 100. Additionally, positive charge organic molecules may be used to form cylindrically shaped blind vias that are less tapered in shape. FIG. 6 schematically illustrates etching of a via 110 within a glass-based article 100 using a hydrofluoric acid etching solution including positive charge organic molecules (positive charge polyelectrolyte molecules 136 in this example). During etching, a via can be classified into two areas: an opened area on the first surface 102 (and second surface 104) proximate and within the first opening 112 (and second opening 114) and a restricted area 117 within a waist W. In the opened area, positive charge polyelectrolyte molecules 136 can effectively align and slow down etching process by inhibiting the hydrogen fluoride molecules 132. Positive charge surfactant molecules 134 perform a similar function. Both the bulk etch rate $E_2$ and a via widening rate within the first opening 112 is slowed down as compared to when no positive charge polyelectrolyte molecules 136 are provided in the etching solution. However, access of the positive charge polyelectrolyte molecules 136 into the restricted area 117 is restricted and thus the positive charge polyelectrolyte molecules 136 cannot as effectively inhibit etching as compared to the opened area. Accordingly, the via etch rate $E_1$ is not as significantly influenced by the positive charge polyelectrolyte molecules 136 as compared to the surface etch rate $E_2$. Positive charge surfactant molecules 134 perform in a similar manner.

Figure 7:
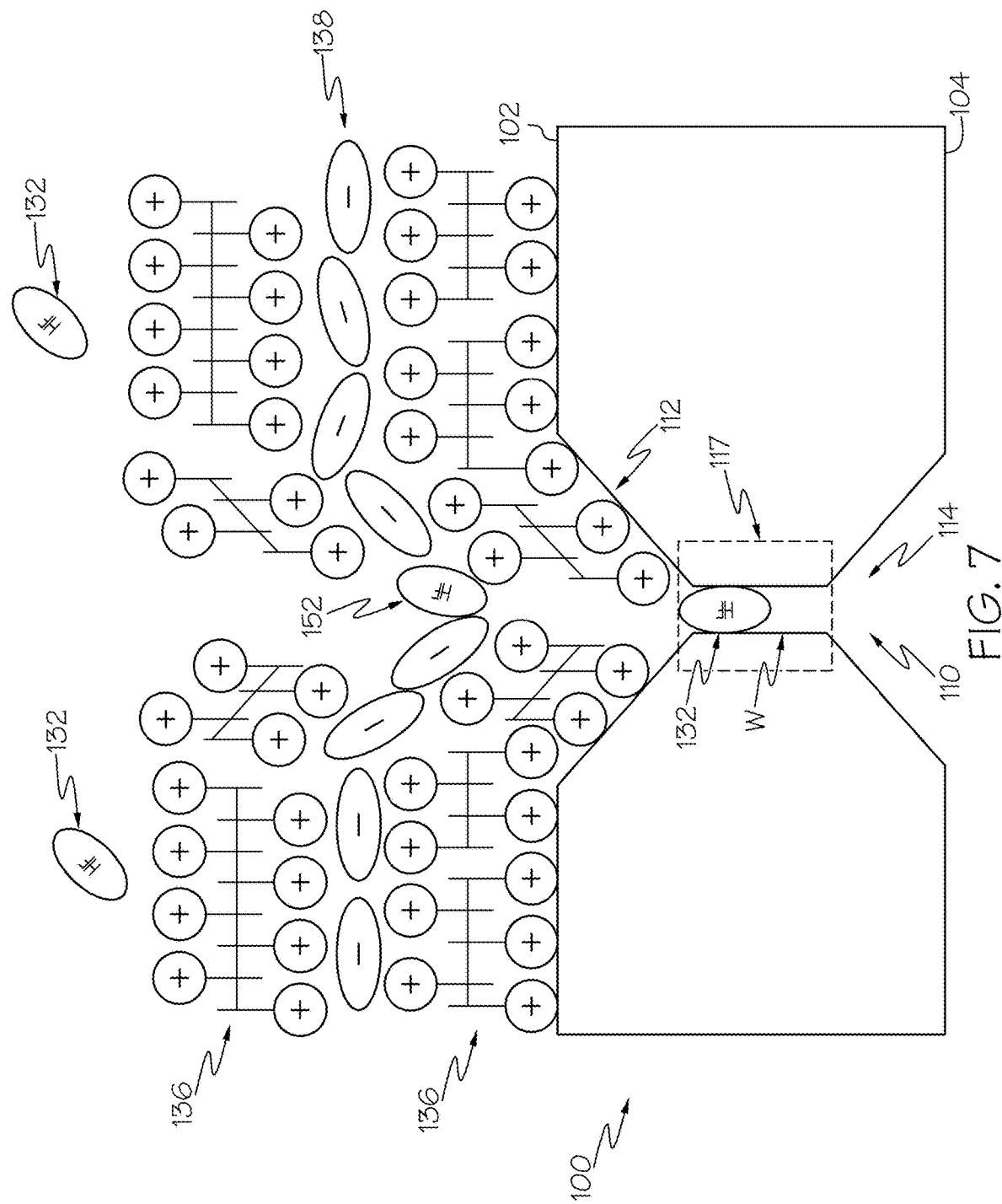
FIG. 7 schematically depicts a via being etched in a glass-based article by an etching solution arranged in multiple layers of positive charge polyelectrolyte, hydrogen fluoride and glass by-products according to one or more embodiments described and illustrated herein.

FIG. 7 is similar to the etching process depicted by FIG. 6 but further includes the depiction of glass by-products 138 that, along with the positive charge polyelectrolyte molecules 136, further inhibit the hydrogen fluoride molecules 132 from contacting the opened area of the first surface 102.

created using one laser burst with a burst number of 15 pulses and a burst energy of about 800.

Following the laser damage process, the glass coupons were statically etched at room temperature (20° C.) in an etching solution comprising a solution of 2.5 wt % HF and 3.5 wt % $HNO_3$ with and without positive charge organic molecules. The final thickness of the glass coupons, the waist diameter, and the first diameter of the first opening (i.e., the openings at the surface into which the laser beam enters the glass coupons) were measured using an optical microscope. The etch time was also recorded. The average top diameter $D_1$, waist diameter $D_W$, final glass coupon thickness, initial glass coupon thickness, etch time, via shape, etch rate $E_1$, etch rate $E_2$, etch ratio, and through time were recorded. It is noted that the via shape is quantified by a thickness of the etched glass coupon divided by two times the difference between the top diameter $D_1$ and the waist diameter $D_W$. Through time is the time that the etching takes to connect the vias from the first surface to the second surface (etch time—$D_W/(2*E_2)$). The results are shown in Table 1 below.

TABLE 1

| etching solution | Top D (μm) | Waist D (μm) | Delta (Top Diameter − Waist Diameter) | final thickness (μm) | initial thickness (μm) | etch time (min) | via shape (T/2)/ (Dt − Dw) | E1 (Via), μm/min | E2 (bulk), μm/min | etch ratio (E1/E2) | through time (min) |
|---|---|---|---|---|---|---|---|---|---|---|---|
| 2.5 wt % HF + 3.5 wt % HNO3 | 82.5 | 27.6 | 54.8 | 305 | 405 | 168.3 | 2.8 | 1.66 | 0.297 | 5.60 | 121.8 |
| 2.5 wt % HF + 3.5 wt % HNO3 + 0.35 wt % PDAD MAC(<100 K) | 81.0 | 46.5 | 34.5 | 303 | 404 | 335 | 4.4 | 1.12 | 0.151 | 7.41 | 180.8 |
| 2.5 wt % HF + 3.5 wt % HNO3 + 0.2 wt % PDAD MAC(100-200 K) | 87.1 | 42.0 | 45.1 | 302 | 402 | 325 | 3.3 | 1.07 | 0.154 | 6.93 | 188.5 |
| 2.5 wt % HF + 3.5 wt % HNO3 + 0.4 wt % PDAD MAC(100-200 K) | 85.6 | 46.9 | 38.6 | 301 | 402 | 326.5 | 3.9 | 1.15 | 0.155 | 7.44 | 174.8 |
| 2.5 wt % HF + 3.5 wt % HNO3 + 0.2 wt % PDAD MAC(>400 K) | 91.0 | 47.5 | 43.6 | 300 | 400 | 340 | 3.4 | 1.12 | 0.147 | 7.61 | 178.6 |
| 2.5 wt % HF + 3.5 wt % HNO3 + 1 wt % CTAB | 81.3 | 33.0 | 48.4 | 304 | 403 | 261 | 3.1 | 1.16 | 0.190 | 6.10 | 174.1 |

However, the positive charge polyelectrolyte molecules 136 and the glass by-products 138 do not easily enter the restricted area 117, allowing the hydrogen fluoride molecules 132 to enter the restricted area 117 and widen the waist W of the via 110, as described above with respect to FIG. 6.

EXAMPLE 1

Figure 8A:
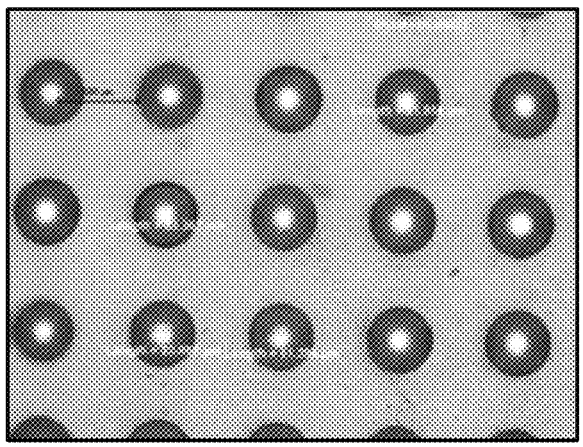
FIG. 8A is an image of a first surface of a glass coupon having vias etched by hydrofluoric acid without positive charge organic molecules with a focus of the image on the first surface to illustrate a first diameter of the vias.
Figure 8B:
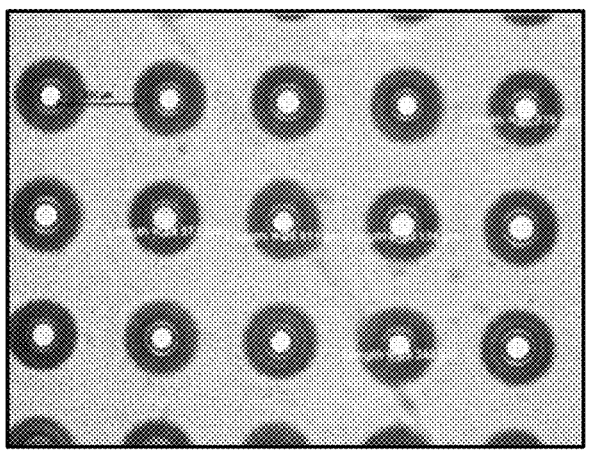
FIG. 8B is an image of the first surface of the glass coupon shown in FIG. 8A with a focus of the image within a bulk of the glass coupon to illustrate the waist diameter of the vias.
Figure 8C:
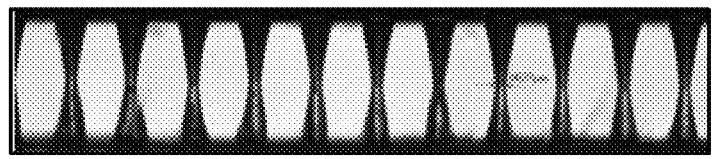
FIG. 8C is a side image of the glass coupon shown in FIGS. 8A and 8B.

To illustrate the effects of positive charge surfactant molecules and positive charge polyelectrolyte molecules within an etching solution in widening the waist of vias, glass coupons were subjected to a laser-and-damage-and-etch process. The 50 mm×50 mm glass coupons were fabricated from alkaline earth boro-aluminosilicate under the trade name Eagle XG® sold by Corning, Inc. of Corning, New York and had a thickness of 0.4 mm. One glass coupon was fabricated per etching condition. 10,000 damage tracks 120 were formed in each of the glass coupons using a 50 ps pulsed laser having 532 nm wavelength, a 3 mm beam diameter that entered the first surface 102, a 30 mm working distance objective, and a 0.7 mm focus line length was present through the glass coupons. Each damage track was FIGS. 8A-8C depict images of vias of etched glass coupons that were etched by 2.5 wt % HF and 3.5 wt % $HNO_3$ (1.45M HF and 0.8M $HNO_3$). Thus, the etched glass coupons shown in FIGS. 8A-8C are representative of control group glass coupons because no positive charge organic molecules were included in the etching solution. The focus of the image of FIG. 8A is on the top surface of the glass coupon to depict the top diameter $D_1$ of the openings (e.g., the first openings 112 shown in FIG. 1), which is represented by the diameter of the dark circles. The focus of the image of FIG. 8B is within the bulk of the glass coupon to depict the waist diameter $D_W$ of the vias, which is represented by the center white circles. FIG. 8C is a side view of the vias of the control glass coupons depicted in FIGS. 8A and 8B.

Referring to Table 1 above, the average top diameter $D_1$ and the average waist diameter $D_W$ of the control glass coupons were 82.5 μm and 27.6 μm, respectively. This resulted in vias with a narrow waist and having an hourglass shape as shown in FIG. 8C.

Figure 9A:
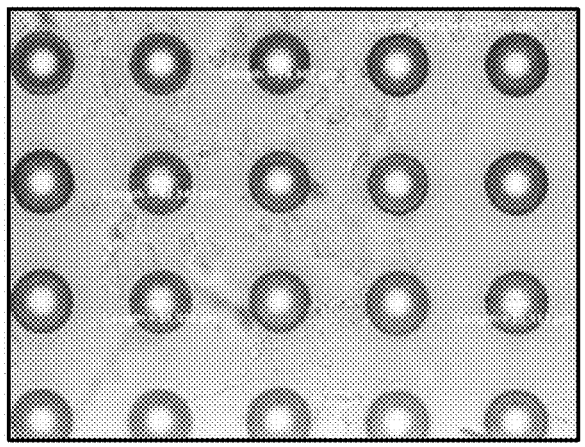
FIG. 9A is an image of a first surface of a glass coupon having vias etched by an etching solution including hydrofluoric acid and CTAB with a focus of the image on the first surface to illustrate a first diameter of the vias according to one or more embodiments described and illustrated herein.
Figure 9B:
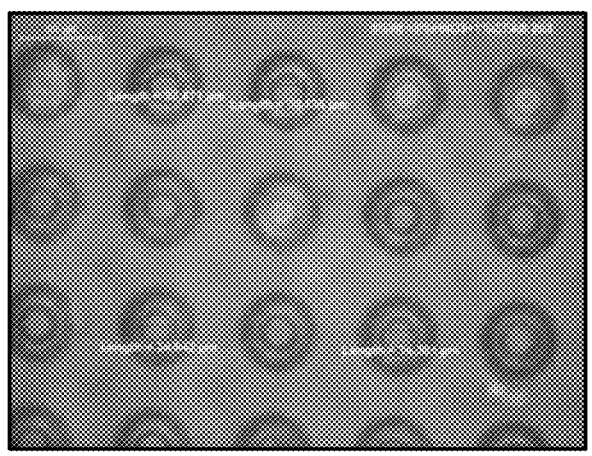
FIG. 9B is an image of the first surface of the glass coupon shown in FIG. 9A with a focus of the image within a bulk of the glass coupon to illustrate the waist diameter of the vias according to one or more embodiments described and illustrated herein.
Figure 9C:
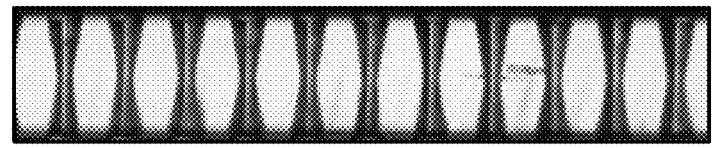
FIG. 9C is a side image of the glass coupon shown in FIGS. 9A and 9B according to one or more embodiments described and illustrated herein.

FIGS. 9A-9C depict images of vias of etched glass coupons that were etched by 2.5 wt % HF and 3.5 wt % $HNO_3$ and 1 wt % CTAB (1.45M HF and 0.8M $HNO_3$ and 1 wt % CTAB). Similar to FIG. 8A, the focus of the image of FIG. 9A is on the top surface of the glass coupon to depict the top diameter $D_1$ of the openings (e.g., the first openings 112 shown in FIG. 1), which is represented by the diameter of the dark circles. The focus of the image of FIG. 9B is within the bulk of the glass coupon to depict the waist diameter $D_W$ of the vias, which is represented by the center white circles. FIG. 9C is a side view of the vias of the glass coupons depicted in FIGS. 9A and 9B.

Referring to Table 1 above, the average top diameter $D_1$ and the average waist diameter $D_W$ for these glass coupons were 81.3 µm and 33.0 µm, respectively. Thus, the CTAB increased the average waist diameter from 27.6 µm to 33.0 µm as compared to the vias of the control glass coupons. The resulting vias as shown in FIG. 9C have less of an hourglass shape than those depicted in FIG. 8C.

Figure 10A:
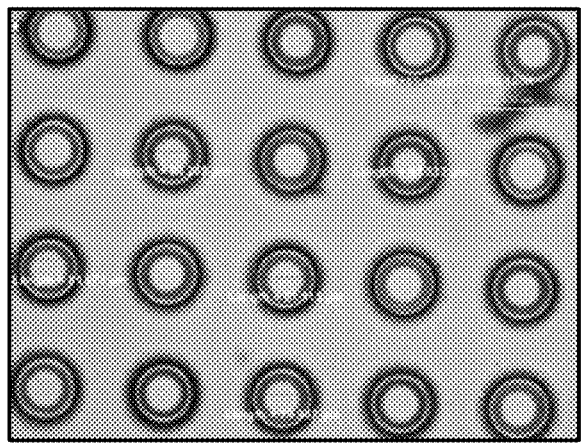
FIG. 10A is an image of a first surface of a glass coupon having vias etched by an etching solution including hydrofluoric acid and PDADMAC with a focus of the image on the first surface to illustrate a first diameter of the vias according to one or more embodiments described and illustrated herein.
Figure 10B:
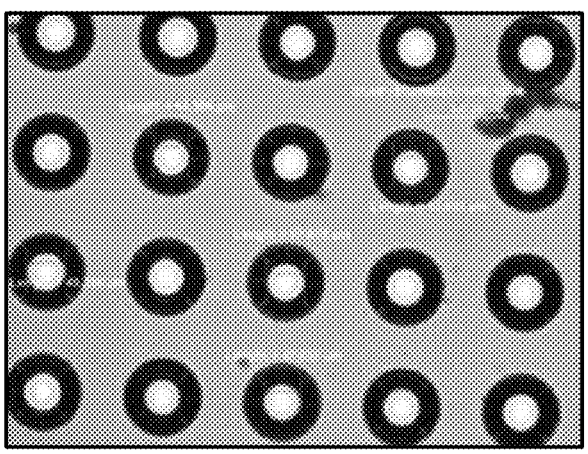
FIG. 10B is an image of the first surface of the glass coupon shown in FIG. 10A with a focus of the image within a bulk of the glass coupon to illustrate the waist diameter of the vias according to one or more embodiments described and illustrated herein.
Figure 10C:
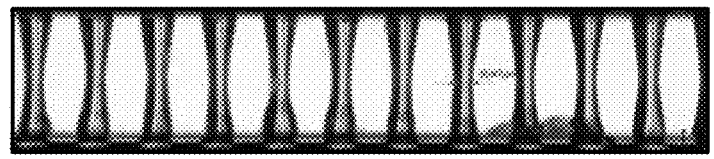
FIG. 10C is a side image of the glass coupon shown in FIGS. 10A and 10B according to one or more embodiments described and illustrated herein.

FIGS. 10A-10C depict images of vias of etched glass coupons that were etched by 2.5 wt % HF and 3.5 wt % $HNO_3$ and 0.35 wt % PDADMAC as a positive charge polyelectrolyte (1.45M HF and 0.8M HNO3 and 0.35 wt % PDADMAC at 100K of molecular weight). Similar to FIGS. 8A and 9A, the focus of the image of FIG. 10A is on the top surface of the glass coupon to depict the top diameter $D_1$ of the openings (e.g., the first openings 112 shown in FIG. 1), which is represented by the diameter of the dark circles. The focus of the image of FIG. 10B is within the bulk of the glass coupon to depict the waist diameter $D_W$ of the vias, which is represented by the center white circles. FIG. 10C is a side view of the vias of the glass coupons depicted in FIGS. 10A and 10B.

Referring to Table 1 above, the average top diameter $D_1$ and the average waist diameter $D_W$ for these glass coupons were 81.0 µm and 46.5 µm, respectively. Thus, the PDADMAC increased the average waist diameter from 27.6 µm to 46.5 µm as compared to the vias of the control glass coupons. The vias of FIG. 10C have less of an hourglass shape than those depicted in FIGS. 8C and 9C.

Referring to Table 1, the glass coupons etched by an etching solution including positive charge organic molecules had a waist diameter $D_W$ of greater than 30 µm.

Figure 11:
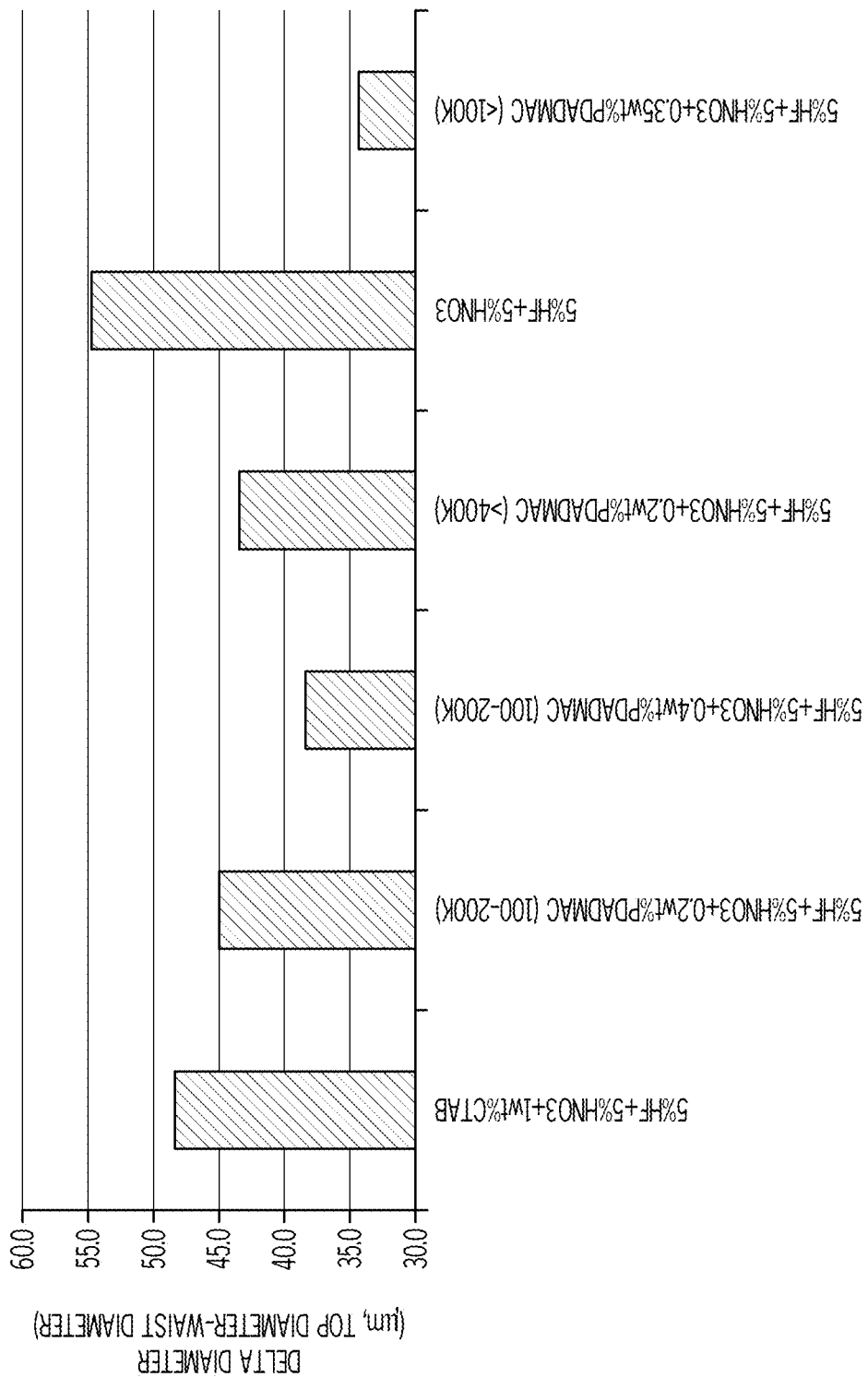
FIG. 11 graphically depicts the delta via diameter for glass coupons etched by a plurality of etching solution compositions according to one or more embodiments described and illustrated herein.

FIG. 11 graphically depicts a chart illustrating a delta via diameter between the top diameter $D_1$ and the waist diameter $D_W$ ($D_1$-$D_W$) using the data from Table 1. The etching solutions illustrated by FIG. 11 are as follows from left to right in the chart:

1) 2.5 wt % HF+3.5 wt % $HNO_3$+1 wt % CTAB,
2) 2.5 wt % HF+3.5 wt % $HNO_3$+0.2 wt % PDADMAC (100-200K),
3) 2.5 wt % HF+3.5 wt % $HNO_3$+0.4 wt % PDADMAC (100-200K),
4) 2.5 wt % HF+3.5 wt % $HNO_3$+0.2 wt % PDADMAC (>400K),
5) 2.5 wt % HF+3.5 wt % $HNO_3$, and
6) 2.5 wt % HF+3.5 wt % $HNO_3$+0.35 wt % PDADMAC (<100K).

Referring to Table 1 and the graph of FIG. 1, glass coupons etched by etching solutions including positive charge organic molecules had a delta via diameter of less than 50 µm. In some embodiments, the glass-based articles may have a delta via diameter of less than or equal to 50 µm for glass-based article thicknesses between 200 µm and 700 µm, including endpoints. The control glass coupons had vias with the highest delta via diameter (about 54.8 µm), while the glass coupons etched by 2.5 wt % HF and 3.5 wt % $HNO_3$ and 0.35 wt % PDADMAC at 100K molecular weight had the smallest delta via diameter (about 34.5 µm). Table 1 shows that the presence of positive charge organic molecules decreases the delta via diameter. The delta via diameter reflects the shape of the etch via and implicates the capability of etching solutions to generate wide opening via waist. The lower delta via diameter suggests better via waist opening, which may provide vias with a more desirable shape for metallization.

Generally, the example shows that positive charge PDADMAC reduced the delta via diameter more effectively than positive charge CTAB. Without being bound by theory, this may be for at least two reasons: (1) the positive charge polyelectrolyte molecule can stay on glass surface much longer (retention time) due to the stronger electrostatic interaction of multiple positive charges per molecule while the positive charge surfactant molecule contains only one positive charge per molecule and has greater potential to depart the glass surface quicker, and (2) the etching inhibitor layer of positive charge polyelectrolyte molecule may make it more difficult for the hydrogen fluoride molecules to penetrate through to reach the surfaces of the glass-based article. For at least these reasons, the positive charge polyelectrolyte molecule reduced the bulk etch rate $E_2$ from 0.3 um/min to 0.15 um/min in this example. The positive charge surfactant molecule reduced the bulk etch rate $E_2$ to 0.2 um/min. In one non-limiting embodiment, the etching solution comprises 4 wt % to 6 wt % HF and 0.0035 wt % to 0.05 wt % PDADMAC, including endpoints.

The size (i.e., the molecular weight) of the positive charge polyelectrolyte molecule may also play a role in restricting via opening at the surfaces, and thus etching vias with a smaller delta via diameter. Polyelectrolytes of smaller molecular weight (100K or less) may be able to access to the via area earlier than polyelectrolytes having a larger size (e.g., molecular weights of 100K-200K, and 400K or larger). Positive charge polyelectrolytes having a smaller size may reduce the via widening rate earlier, and reduce the delta via diameter more effectively.

Accordingly, the above-example shows that positive charge surfactants and positive charge polyelectrolytes, when included in a hydrofluoric acid etching solution, are capable of increasing the waist diameter $D_W$ and therefore decreasing the delta via diameter between the top diameter and the waist diameter ($D_1$-$D_W$).

EXAMPLE 2

To illustrate the impact of the concentration of positive charge polyelectrolyte in the etching solution on delta via diameter and etching rate, damage tracks were formed in glass coupons as described above with respect to Example 1. The composition and thickness of the glass coupons were the same as the glass coupons of Example 1.

Figure 12:
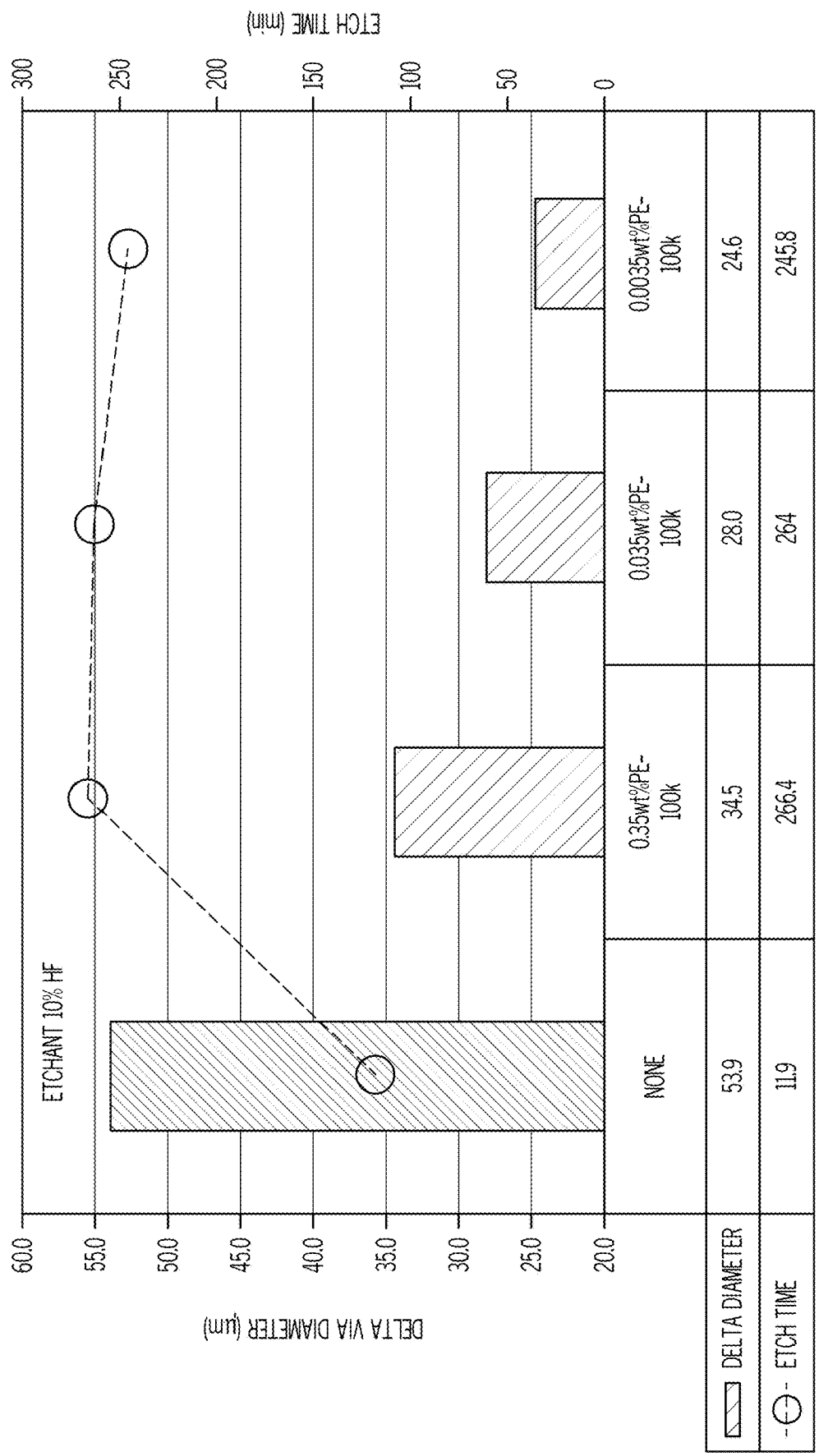
FIG. 12 graphically depicts the delta via diameter and etch rate for glass coupons etched by a plurality of etching solution compositions having varying concentrations of PDADMAC according to one or more embodiments described and illustrated herein.
Figure 13A:
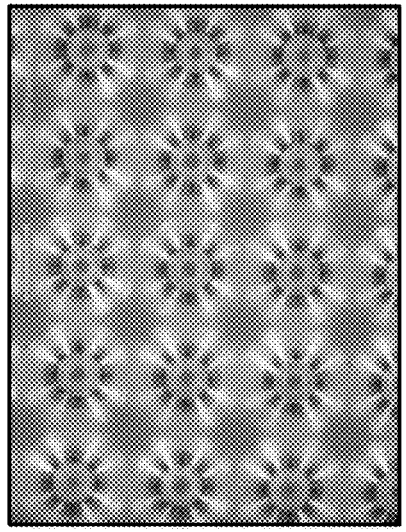
FIGS. 13A-13D are images of the first surface of glass coupons etched by the etching solution compositions of FIG. 12 according to one or more embodiments described and illustrated herein.
Figure 13B:
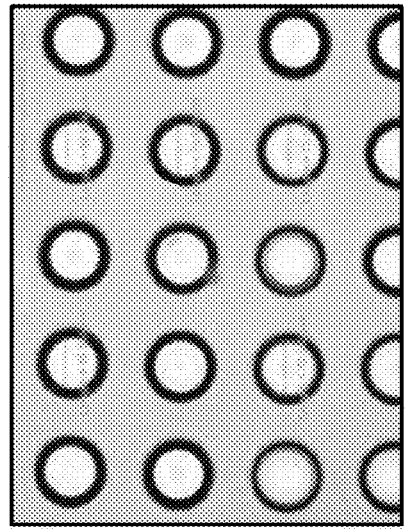
Figure 13C:
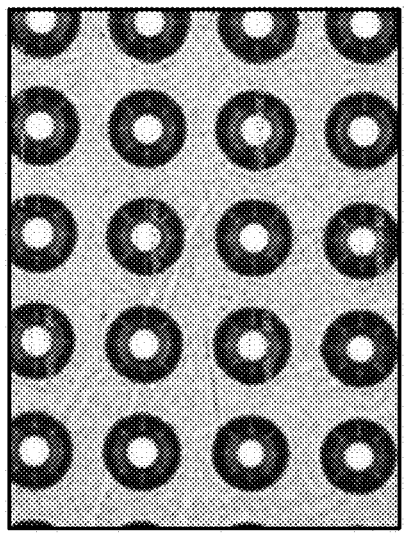
Figure 13D:
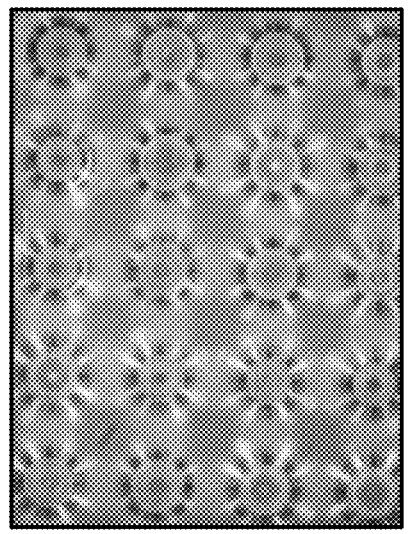

Four sets of glass coupons were etched using an etching solution comprising hydrofluoric acid without mineral acids. A first set included control glass coupons that were etched using 3M HF (5 wt %) without positive charge organic molecules. An image of the waists of sample vias of the control glass coupons is illustrated in FIG. 13A. FIG. 12 is a bar graph showing delta diameter versus etchant for the glass coupons shown in FIGS. 13A-13D. For FIGS. 13A-13D, the focus of the images is on the waist of the vias to illustrate waist diameter $D_W$. A second set of glass coupons was etched using 3M HF (5 wt %) with 0.35 wt % PDADMAC having a molecular weight of 100K. FIG. 13B shows the resulting vias. A third set of glass coupons was etched using 3M HF (5 wt %) with 0.035 wt % PDADMAC having a molecular weight of 100K. FIG. 13C shows the resulting vias. A fourth set of glass coupons was etched using 3M HF (5 wt %) with 0.0035 wt % PDADMAC having a molecular weight of 100K. FIG. 13D shows the resulting vias.

Referring to FIG. 12, low concentration of PDADMAC (0.0035 wt %) provided the smallest delta via diameter and therefore the most ideal via shapes. Thus, only a small amount of positive charge polyelectrolyte may be needed to have a large impact on via shape. Additionally, use of a lower concentration of positive charge polyelectrolytes may also reduce the etch time as compared with higher concentrations of positive charge polyelectrolytes.

To illustrate the effect of the concentration of positive charge polyelectrolyte in etching solutions with and without a mineral acid on delta via diameter and etching rate, damage tracks were formed in glass coupons as described above with respect to Example 1. The composition and thickness of the glass coupons were the same as the glass coupons of Example 1.

Figure 14:
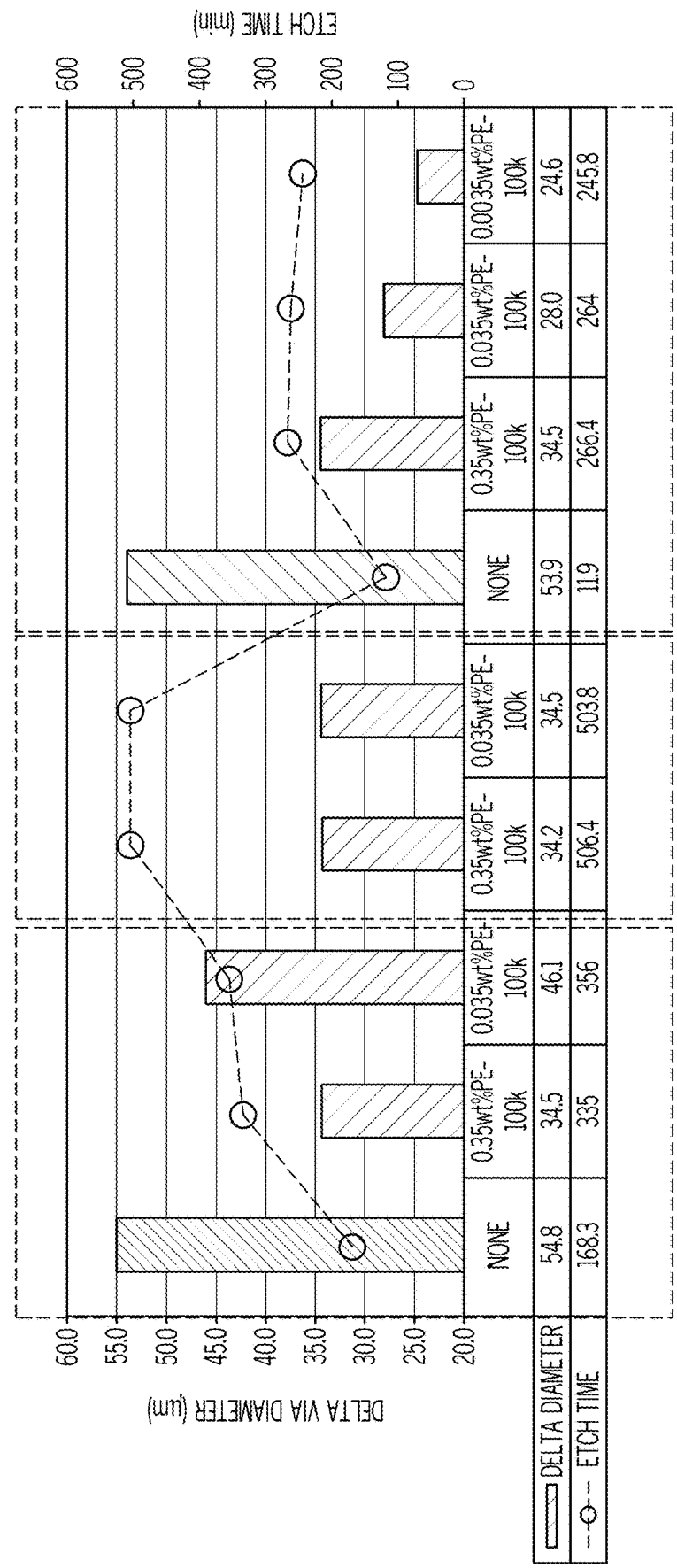
FIG. 14 graphically depicts the delta via diameter and etch rate for glass coupons etched by a plurality of etching solution compositions having varying concentrations of PDADMAC and with and without $HNO_3$, according to one or more embodiments described and illustrated herein.

Nine sets of glass coupons having damage tracks were etched according to the compositions shown in the graph of FIG. 14. As shown in FIG. 14, when the etching solution includes $HNO_3$ (etching solution formulation 2.5 wt % HF-3.5 wt % $HNO_3$) in the example) a higher concentration (0.35 wt %) of PDADMAC yields a smaller delta via diameter than a lower concentration (0.035 wt %) of PDADMAC. When the etching solution included 2.5 wt % HF without a mineral acid, the delta via diameter and the etch time were nearly the same whether the etching solution included 0.35 wt % or 0.035 wt % PDADMAC. However, as also shown in FIG. 13, a lowest evaluated concentration PDADMAC (0.0035 wt %) provides the smallest delta via diameter and etch time.

It is noted that the presence of residue positive charge organic molecules in the etching solution tank may undesirably affect the etching results of subsequent etching processes. Thus, the etching solution tank should be cleaned to remove the positive charge organic molecules if the effects of the positive charge organic molecules are not desired. According to some embodiments, the etching solution tank may be neutralized of the positive charge organic molecules by adding negative charge organic molecules that are attracted to the positive charge organic molecules and remove the positive charge organic molecules from the surfaces of the glass-based article. Example negative charge organic molecules include, but are not limited to, anionic surfactants. Example anionic surfactants include, but are not limited to, sodium dodecyl sulfate ($NaC_{12}H_{25}SO_4$) ("SDS") and fatty acid salts, such as sodium stearate.

Figure 15:
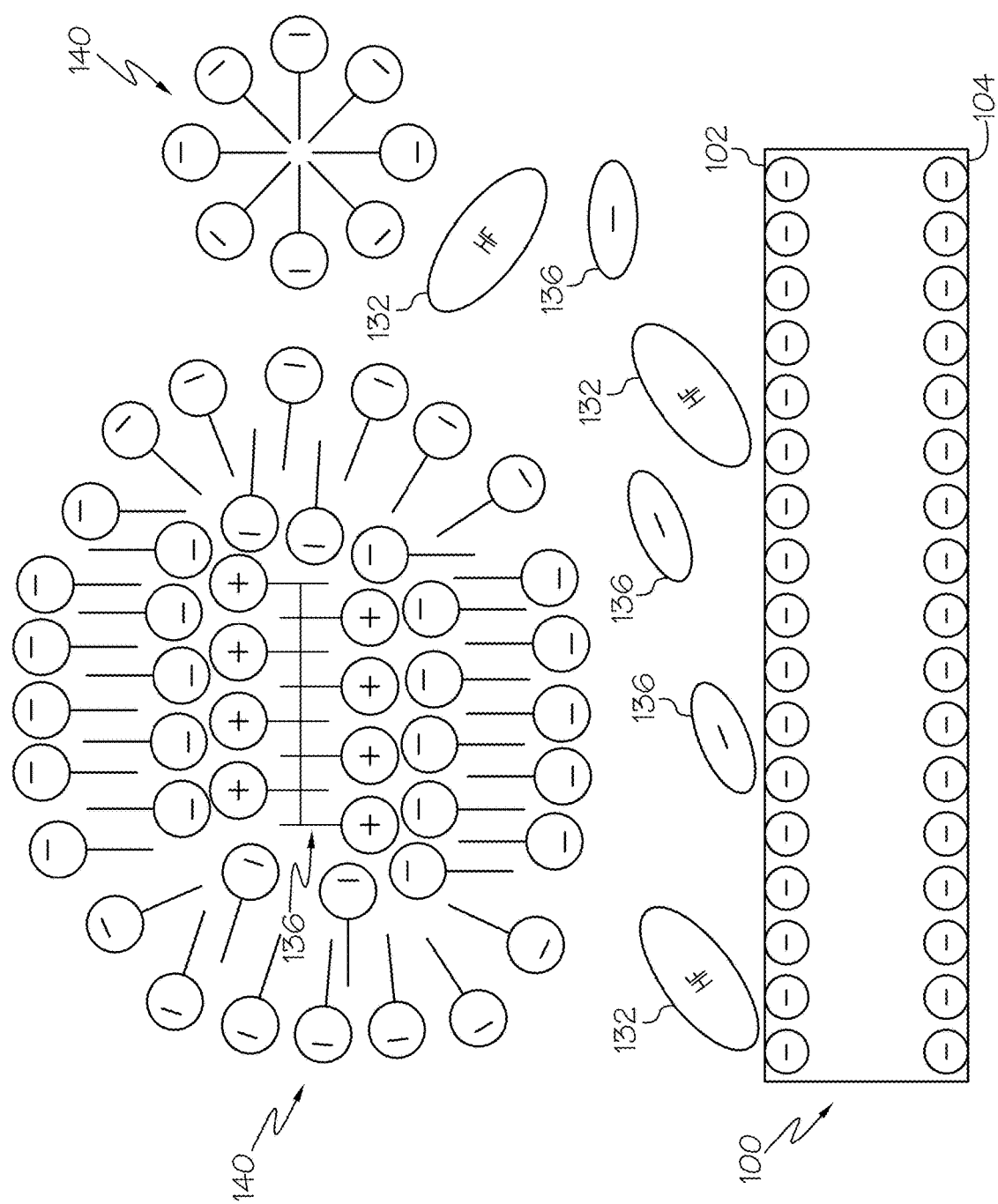
FIG. 15 schematically depicts a glass-based article in an etching solution including a positive charge polyelectrolyte and a negative charge organic molecule according to one or more embodiments described and illustrated herein.

FIG. 15 schematically depicts an etching solution including negative charge SDS molecules 140, positive charge polyelectrolyte molecules 136, and hydrogen fluoride molecules 132. The negative charge SDS molecules 140 are attracted to the positive charge polyelectrolyte molecules 136 and remove the positive charge polyelectrolyte molecules 136 from the first surface 102 (and second surface 104) of the glass-based article 100. This allows access for the hydrogen fluoride molecules 132 to contact the first surface 102 (and second surface 104) of the glass-based article 100. Thus, the negative charge SDS molecules 140 counteract the positive charge polyelectrolyte molecules 136 resulting in a fast bulk etch rate $E_2$.

EXAMPLE 3

To illustrate the effect of negative SDS molecules on the delta via diameter and etch time, two additional sets of glass coupons were etched by a laser-damage-and-etch process using a first etching solution comprising 5 wt % HF+0.0035 wt % PDADMAC (100K)+0.1 wt % SDS and a second etching solution comprising 5 wt % HF+0.1 wt % SDS. The composition and thickness of the glass coupons were the same as the glass coupons of Example 1. The damage tracks were formed as described above with respect to Example 1.

Figure 16:
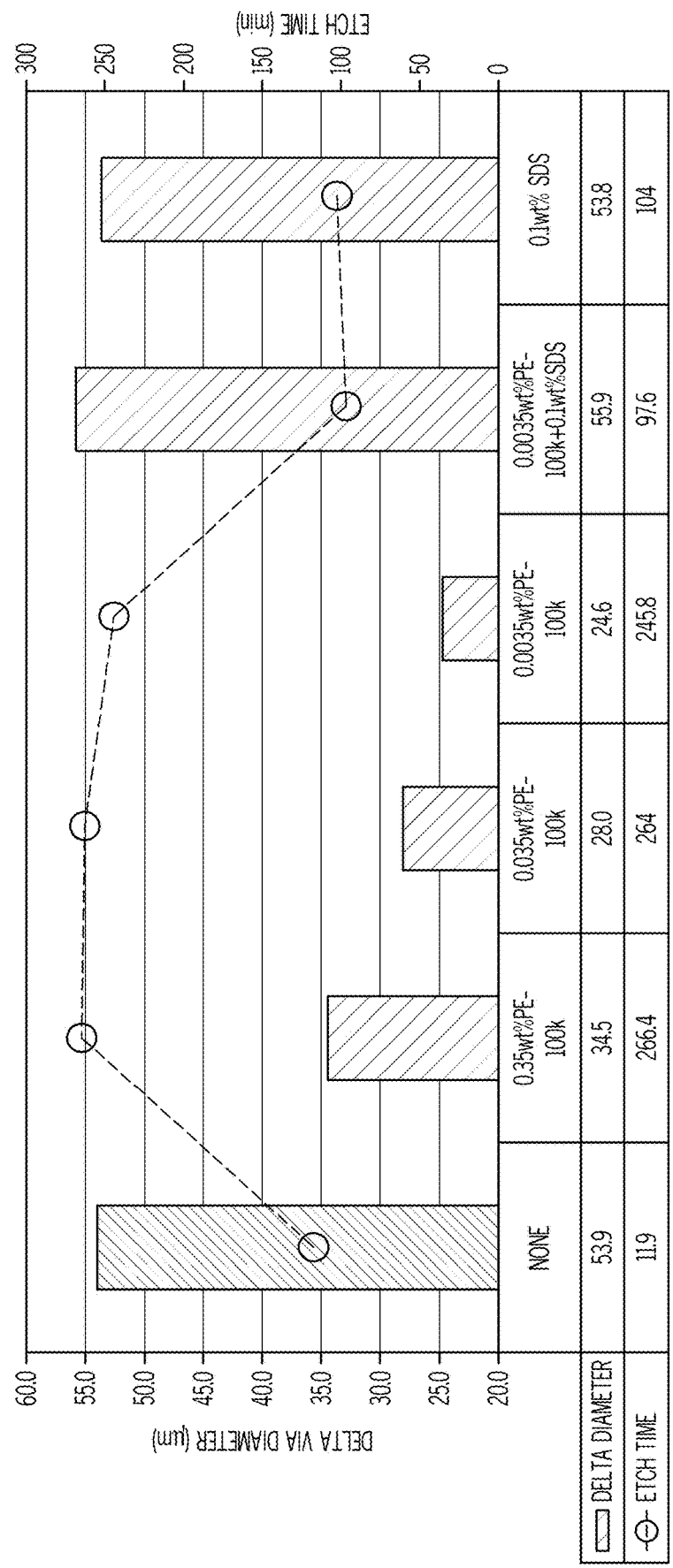
FIG. 16 graphically depicts the delta via diameter and etch rate for glass coupons etched by a plurality of etching solution compositions having varying concentrations of PDADMAC and SDS according to one or more embodiments described and illustrated herein.

FIG. 16 is a chart that compares the etching solutions shown in FIG. 12 with the two etching solutions including SDS as described above. As shown in FIG. 16, the presence of SDS increases the delta via diameter (i.e., decreases the waist diameter $D_W$ of the vias) and decreases the etch time. This may be due to a lack of positive charge PDADMAC molecules that reduces access of the hydrogen fluoride molecules to the surfaces of the glass coupons.

Figure 17A:
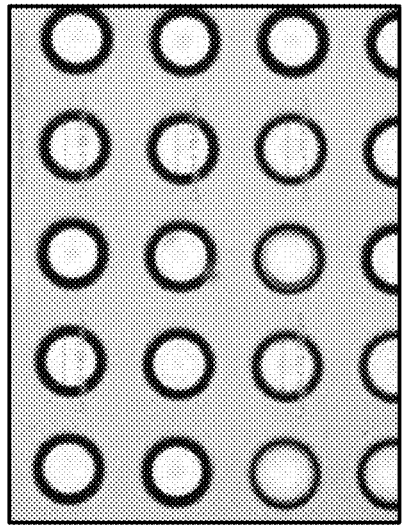
FIG. 17A is an image of a top surface of a glass coupon etched by hydrofluoric acid without positive charge organic molecules with a focus of the image within a bulk of the glass coupon to illustrate the waist diameter of the vias.
Figure 17B:
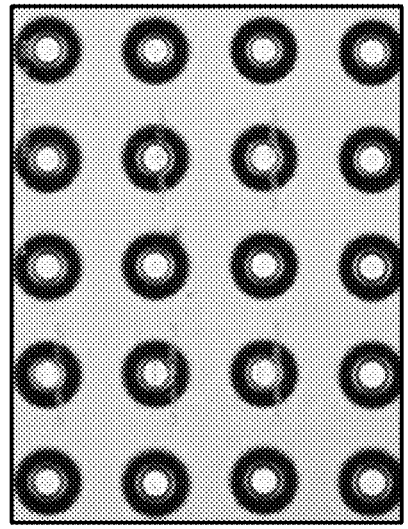
FIG. 17B is an image of a top surface of a glass coupon etched by an etching solution including hydrofluoric acid and PDADMAC with a focus of the image within a bulk of the glass coupon to illustrate the waist diameter of the vias according to one or more embodiments described and illustrated herein.
Figure 17C:
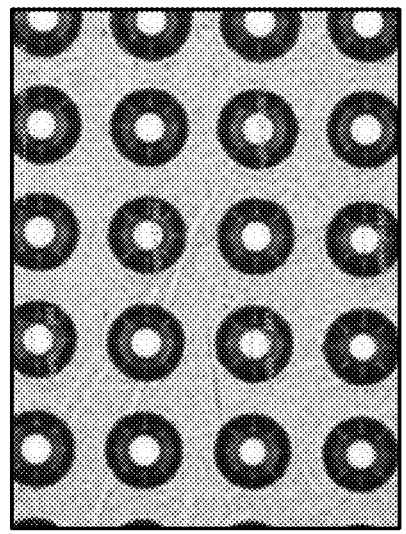
FIG. 17C is an image of a top surface of a glass coupon etched by an etching solution including hydrofluoric acid, PDADMAC and SDS with a focus of the image within a bulk of the glass coupon to illustrate the waist diameter of the vias according to one or more embodiments described and illustrated herein.
Figure 17D:
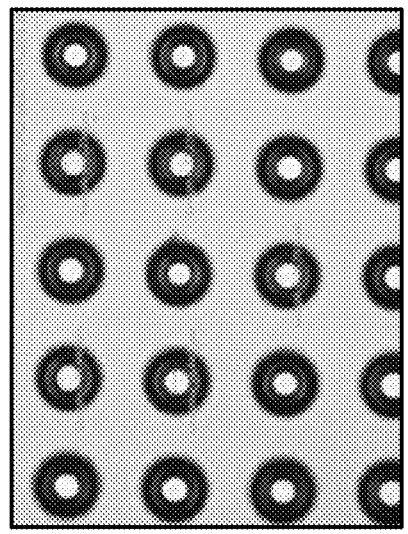
FIG. 17D is an image of a top surface of a glass coupon etched by an etching solution including hydrofluoric acid and SDS with a focus of the image within a bulk of the glass coupon to illustrate the waist diameter of the vias according to one or more embodiments described and illustrated herein.

FIGS. 17A-17D illustrate the evolution of the change in waist diameter size as positive charge PDADMAC molecules are added to the etching solution and then negative charge SDS molecules are added to the etching solution. Particularly, FIG. 17A depicts a glass coupon with vias etched by 5 wt % HF, FIG. 17B depicts a glass coupon etched by 5 wt % HF+0.035 wt % PDADMAC (100K), FIG. 17C depicts a glass coupon etched by 5 wt % HF+0.035 wt % PDADMAC (100K)+0.1 wt % SDS, and FIG. 17D depicts a glass coupon etched by 5 wt % HF+0.1 wt % SDS. As shown in FIGS. 17A-17D, the vias have a narrow waist when no PDADMAC is present (FIG. 17A), and comparatively widened vias when PDADMAC is present. FIGS. 17C and 17D illustrate that the vias are once again narrow when SDS is present. Thus, negative SDS molecules may be provided to the etching solution tank to remove residue positive charge organic molecules.

It should now be understood that embodiments of the present disclosure are directed to methods of etching vias in glass-based articles that increase the waist diameter of vias by slowing down the bulk etch rate of the open areas of the surfaces of the glass-based article while permitting etching of the waist of the via. Therefore, embodiments may result in vias having a more cylindrical and less hourglass-shaped profile which may be beneficial for downstream metallization processes. Particularly, positive charge organic molecules are added to the etching solution to provide an etching inhibitor layer at the surfaces of the glass-based article. However, hydrogen fluoride molecules are able to enter the waist such that etching of the waist of the vias is not substantially impeded. Because the bulk etch rate is reduced, less glass is etched away and less etching solution may be used, which reduces material costs.

While the embodiments herein are described with respect to hourglass and cylindrical shaped vias, the embodiments are equally applicable to any other via shape where it is desired to slow the bulk etch rate of the surfaces of the glass-based article relative to the etch rate of via surfaces.

It is noted that, in some cases, a surface haze is present in the etched glass-based articles. The surface haze may be reduced by including nitric acid in the etching solution, increasing the concentration of hydrogen fluoride, or increasing the concentration of positive charge polyelectrolyte molecules.

While exemplary embodiments have been described herein, it will be understood by those skilled in the art that various changes in form and details may be made therein without departing from the scope encompassed by the appended claims.

The invention claimed is:

1. A method of forming a via in a glass-based article, the method comprising:

applying an etching solution to at least a first surface of the glass-based article, the etching solution comprising a positive charge organic molecule and at least one acid, wherein:
  prior to the application of the etching solution, the glass-based article has a damage track formed through a bulk of the glass-based article in a damaged region of the glass-based article the damage track extending from the first surface of the glass-based article to a second surface of the glass-based article, and
  a pH value of the etching solution is greater than an isoelectric point of the glass-based article;
forming an etching inhibitor layer with the positive charge organic molecule on an undamaged region of the glass-based article such that the etching inhibitor layer retards etching of the glass-based article from the at least one acid such that an etch rate of the undamaged region $E_2$ is lower than an etch rate of the damaged region $E_1$, a ratio of $E_1/E_2$ being greater than 1 and less than 20; and
etching the damage track in the damaged region with the at least one acid to form the via.

2. The method of claim 1, wherein the positive charge organic molecule comprises:
  a hydrophilic portion comprising a positive charge; and
  a hydrophobic portion.

3. The method of claim 1, wherein the positive charge organic molecule comprises one or more of at least one surfactant and at least one polyelectrolyte.

4. The method of claim 1, wherein the positive charge organic molecule comprises cetrimonium bromide.

5. The method of claim 1, wherein the positive charge organic molecule comprises poly(diallyldimethylammonium chloride).

6. The method of claim 5, wherein a concentration of the positive charge organic molecule is with a range of 0.0035 wt % to 10 wt % including endpoints.

7. The method of claim 1, wherein the at least one acid comprises hydrofluoric acid.

8. The method of claim 7, wherein a concentration of the hydrofluoric acid is within a range of 1 wt % to 20 wt % including endpoints.

9. The method of claim 7, wherein the at least one acid further comprises a mineral acid.

10. The method of claim 9, wherein a concentration of the mineral acid is less than or equal to 40 wt %.

11. The method of claim 9, wherein the mineral acid is one or more of hydrochloric acid, nitric acid, sulfuric acid, phosphoric acid, acetic acid, and tartaric acid.

12. The method of claim 11, wherein the etching solution further comprises a fluoride-containing compound.

13. The method of claim 12, wherein the fluoride-containing compound comprises one or more of ammonium fluoride, potassium fluoride, sodium fluoride, ammonium bifluoride, potassium bifluoride, and sodium bifluoride.

14. The method of claim 1, wherein the glass-based article comprises aluminosilicate glass, borosilicate glass, fused silica, soda lime glass, or glass-ceramic.

15. The method of claim 1, wherein:
  the glass-based article has a thickness within a range of 200 μm to 700 μm after etching, including endpoints, and
  the via has a waist diameter $D_w$ that is less than a first diameter $D_1$ at the first surface and is less than a second diameter $D_2$ at the second surface.

16. The method of claim 15, wherein the via has a delta via diameter that is less than or equal to 50 μm.

17. The method of claim 1, wherein the etching inhibitor layer further comprises a layer of glass by-products.

18. The method of claim 1, wherein the etching inhibitor layer comprises a polyelectrolyte.

19. A method of forming a via in a glass-based article, the method comprising:
  applying a pulsed laser beam having a line focus through a bulk of the glass-based article to form a damage track in a damaged region of the glass-based article, the damage track extending through the bulk of the glass-based article from a first surface of the glass-based article to a second surface of the glass-based article;
  applying an etching solution to at least first surface of the glass-based article, the etching solution comprising PDADMAC and hydrofluoric acid, and
  a pH value of the etching solution being greater than an isoelectric point of the glass-based article; and
  forming an etching inhibitor layer with the PDADMAC on an undamaged region of the glass-based article such that the etching inhibitor layer retards etching of the glass-based article from the hydrofluoric acid such that an etch rate of the undamaged region $E_2$ is lower than an etch rate of the damaged region $E_1$, a ratio of $E_1/E_2$ being greater than 1 and less than 20.

20. The method of claim 19, wherein the etching solution comprises 4-6 wt % hydrofluoric acid and between 0.0035 wt % and 0.05 wt % PDADMAC.

* * * * *